United States Patent
Ma

(10) Patent No.: US 7,227,359 B2
(45) Date of Patent: Jun. 5, 2007

(54) METHOD AND APPARATUS FOR PHASE-SENSITIVE MAGNETIC RESONANCE IMAGING

(75) Inventor: Jingfei Ma, Houston, TX (US)

(73) Assignee: Boards of Regents, The University of Texas System, Austin, TX (US)

( * ) Notice: Subject to any disclaimer, the term of this patent is extended or adjusted under 35 U.S.C. 154(b) by 251 days.

(21) Appl. No.: 10/997,826

(22) Filed: Nov. 24, 2004

(65) Prior Publication Data
US 2005/0165296 A1 Jul. 28, 2005

Related U.S. Application Data

(60) Provisional application No. 60/525,143, filed on Nov. 26, 2003.

(51) Int. Cl.
*G01V 3/00* (2006.01)
(52) U.S. Cl. ...................................... 324/309; 324/307
(58) Field of Classification Search ................ 324/309, 324/307
See application file for complete search history.

(56) References Cited

U.S. PATENT DOCUMENTS

| | | | |
|---|---|---|---|
| 5,133,357 A | 7/1992 | Dumoulin et al. |
| 5,204,627 A | 4/1993 | Mistretta et al. |
| 5,229,717 A | 7/1993 | Hinks |
| 5,237,273 A | 8/1993 | Plewes et al. |
| 5,541,513 A | 7/1996 | Maier |
| 5,672,969 A | 9/1997 | Zhou et al. |
| 5,909,119 A * | 6/1999 | Zhang et al. ............... 324/309 |
| 6,192,263 B1 * | 2/2001 | Ma ............................ 600/410 |
| 6,397,096 B1 * | 5/2002 | Liu et al. .................... 600/419 |
| 6,472,872 B1 | 10/2002 | Jack et al. |
| 6,583,624 B1 | 6/2003 | Muthupillai et al. |
| 2004/0064032 A1 | 4/2004 | Ma |

OTHER PUBLICATIONS

AHN, C.B., et al., "High-Speed Spiral-Scan Echo Planar NMR Imaging-I, IEEE Transactions on Medical Imaging," vol. MI-5, No. 1, p. 2-7, Mar. 1986.

(Continued)

*Primary Examiner*—Louis M. Arana
(74) *Attorney, Agent, or Firm*—Bracewell & Giuliani, LLP

(57) ABSTRACT

Systems and methods are described for phase-sensitive magnetic resonance imaging using an efficient and robust phase correction algorithm. A method includes obtaining a plurality of MRI data signals, such as two-point Dixon data, one-point Dixon data, or inversion recovery prepared data. The method further includes implementing a phase-correction algorithm, that may use phase gradients between the neighboring pixels of an image. At each step of the region growing, the method uses both the amplitude and phase of pixels surrounding a seed pixel to determine the correct orientation of the signal for the seed pixel. The method also includes using correlative information between images from different coils to ensure coil-to-coil consistency, and using correlative information between two neighboring slices to ensure slice-to-slice consistency. A system includes a MRI scanner to obtain the data signals, a controller to reconstruct the images from the data signals and implement the phase-correction algorithm, and an output device to display phase sensitive MR images such as fat-only images and/or water-only images.

113 Claims, 17 Drawing Sheets

OTHER PUBLICATIONS

Bernstein, M.A., et al., "Improved detectability in low signal-to-noise ratio magnetic resonance images by means of a phase-corrected real reconstruction," Med. Phys. 16(5), p. 813-817, Sep./Oct. 1989.

Borrello, J. A., et al., "Regional Phase Correction of Inversion-Recovery MR Images," Magnetic Resonance in Medicine 14, 56-57 (1990).

Bydder, G.M., et al., "MR Imaging: Clinical Use of the Inversion Recovery Sequence,": Journal of Computer Assisted Tomography 9(4): 659-675, Jul. Aug. 1985.

Edelstein, W.A., et al., Journal of Computer Assisted Tomography 7(3): 391-401, Jun. 1983.

Gowland, P.A., et al., "A Simple Method for the Restoration of Signal Polarity in Multi-image Inversion Recovery Sequences for Measuring T1," Magnetic Resonance in Medicine 18, 224-231 (1991).

Ji, J.X., et al., "Phase-Sensitive Inversion Recovery Using a Markov Random Field Model," Proc. Intl. Soc. Mag. Reson. Med. 11 p. 1068, (2003).

Kellman, P., et al., "Phase-Sensitive Inversion Recovery for Detecting Myocardial Infarction Using Gadolinium-Delayed Hyperenhancement," Magnetic Resonance in Medicine 47: 372-383 (2002).

Listerud, J., et al., "OIL FLAIR: Optimized Interleaved Fluid-Attenuated Inversion Recovery in 2D Fast Spin Echo," Magnetic Resonance in Medicine 36: 320-325 (1996).

Ma, J., "Phase-Sensitive IR Imaging and its Application for Tissue Segmentation," Proceedings in 7$^{th}$ ISMRM, PA, p. 1652, 1999.

Ma, J., "Phase correction in two-point Dixon water and fat imaging using a three-dimensional region-growing algorithm," Proceedings in 12$^{th}$ ISMRM, Japan, p. 2134, 2004.

Ma, J., "Breath-Hold Water and Fat Imaging Using a Dual-Echo Two-Point Dixon Technique With and Efficient and Robust Phase-Correction Algorithm," Magnetic Resonance in Medicine 52:415-419 (2004).

Mai, V., et al., "Imaging Pulmonary Blood Flow and Perfusion Using Phase-Sensitive Selective Inversion Recovery," Magnetic Resonance in Medicine 43:793-795 (2000).

McVeigh, E.R., et al., "Phase and sensitivity of receiver coils in magnetic resonance imaging," Med. Phys. 13(6), p. 806-814, Nov./Dec. 1986.

Moran, P.R., et al., "Tissue Contrast Enhancement: Image Reconstruction Algorithm and Selection of $T_1$ in Inversion Recovery MRI," Magnetic Resonance Imaging, vol. 4, pp. 229-235, 1986.

Noll, D.C., et al., "Homodyne Detection in Magnetic Resonance Imaging," IEEE Transactions on Medical Imaging, vol. 10, No. 2, p. 154-163, Jun. 1991.

Oh, C.H., et al., "An Optimized Multislice Acquisition Sequence for the Inversion-Recovery MR Imaging," Magnetic Resonance Imaging, vol. 9, pp. 903-908, 1991.

Park, H.W., et al., "Real-Value Representation in Inversion-Recovery NMR Imaging by Use of a Phase-Correction Method," Magnetic Resonance in Medicine, 3, 15-23 (1986).

Roemer, P.B., et al., "The NMR Phased Array," Magnetic Resonance in Medicine 16, 192-225 (1990).

Wehrli, F.W., et al., "Mechanisms of Contrast in NMR Imaging," Journal of Ocmputeer Assisted Tomography 8(3): 369-380, Jun. 1984.

Xiang, Q.S., et al., "Water-Fat Imaging with Direct Phase Encoding," ISMRM, 1997.

Simmons et al., "Application of the Extremum Stack to Neurological MRI," IEEE Transaction Medical Imaging, vol. 17, No. 3, p. 371-382, Jun. 1998.

Christophe, C., "Mapping of normal brain maturation in infants on phase-sensitive inversion-recovery MR images," Neuroradiology (1990) 32: 173-178.

Hajnal, J.V., "Use of Fluid Attenuated Inversion Recovery (FLAIR) Pulse Sequences in MRI of the Brain," Journal of Computer Assisted Tomography 16(6): 841-844 Nov./Dec. 1992.

* cited by examiner

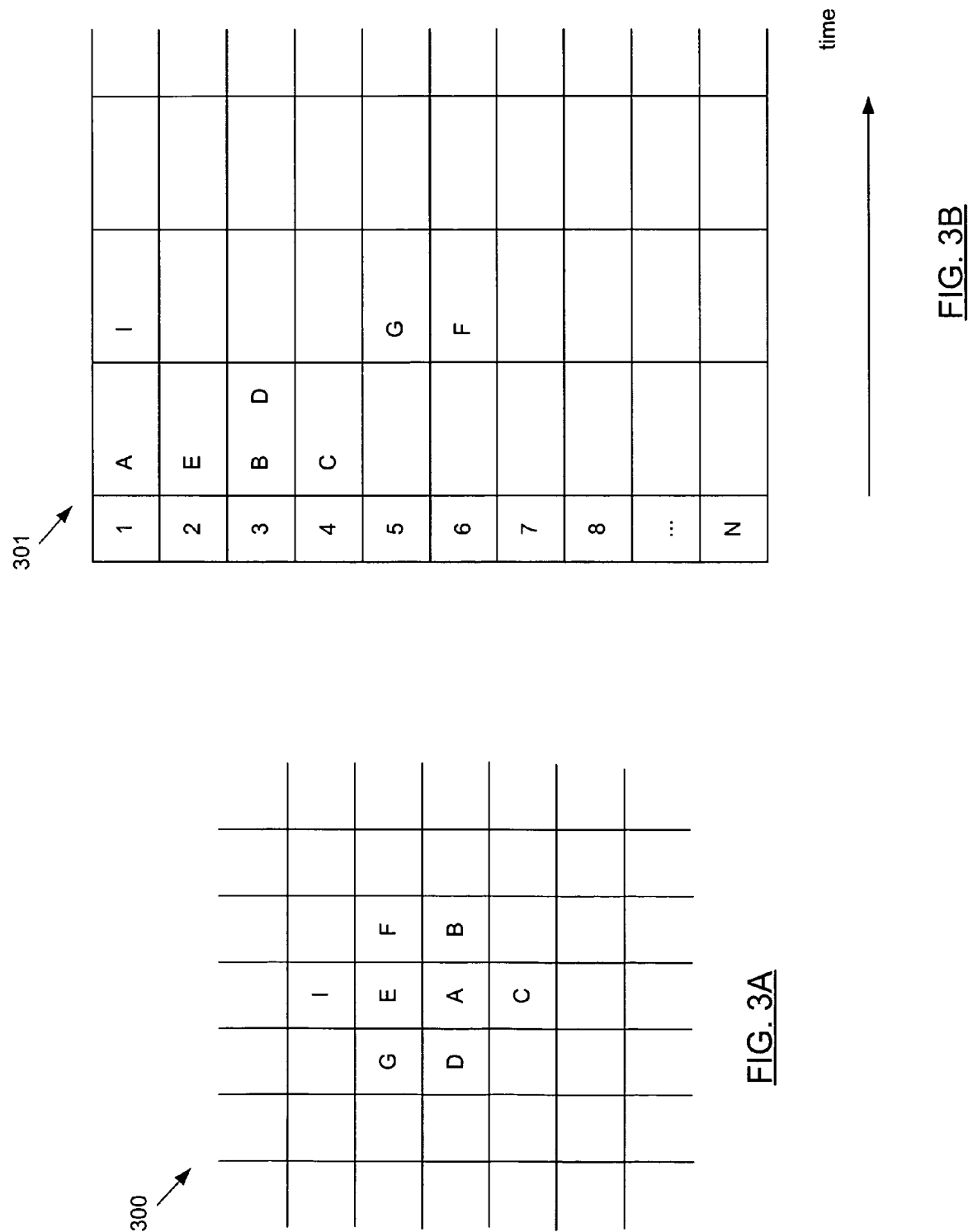

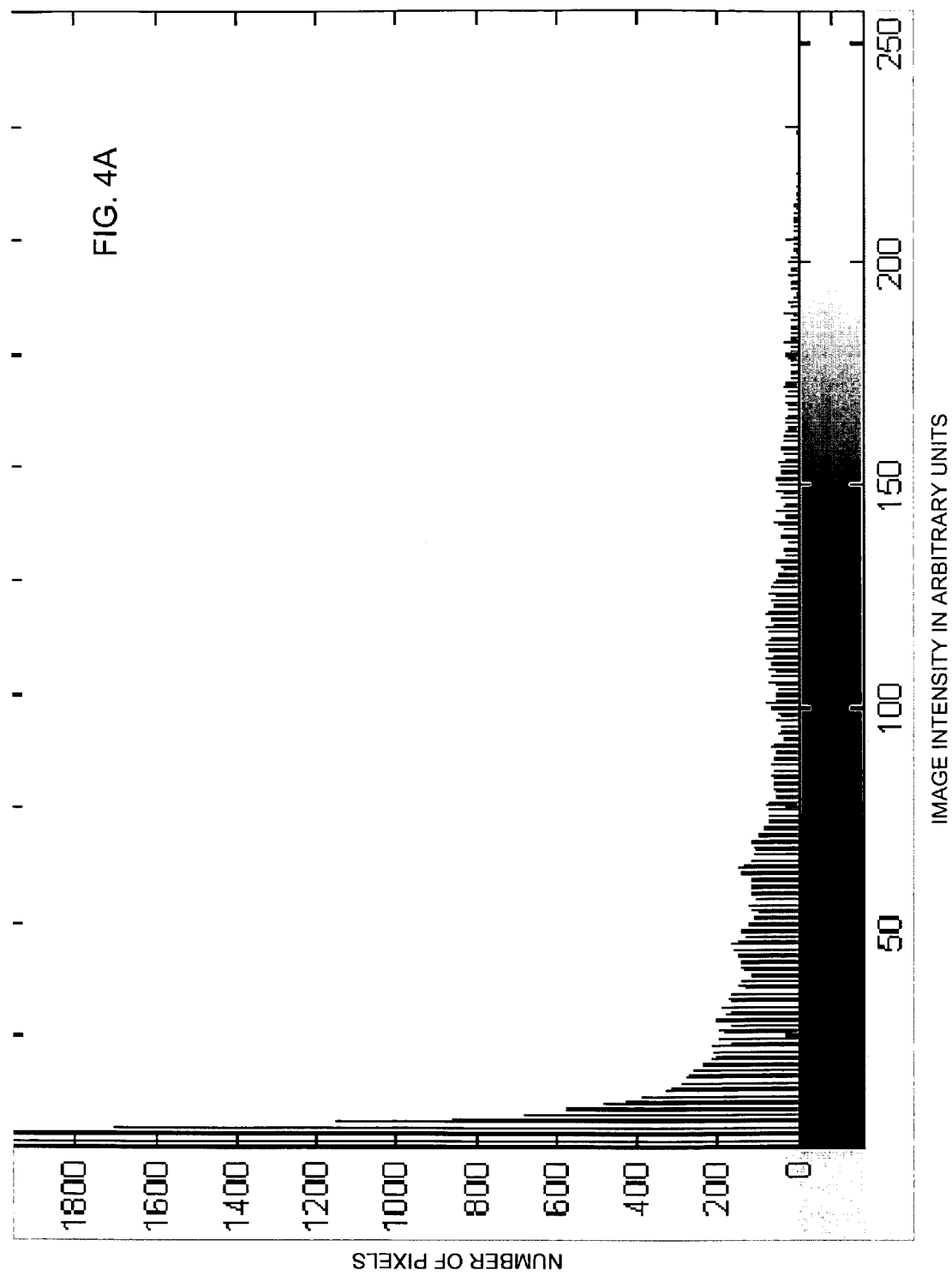

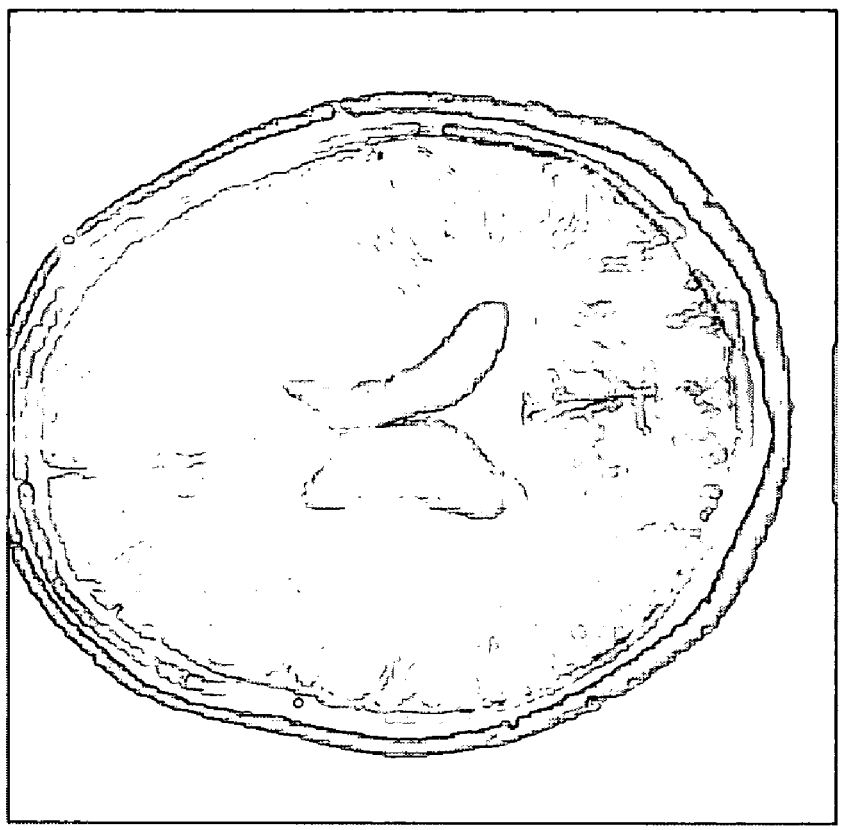
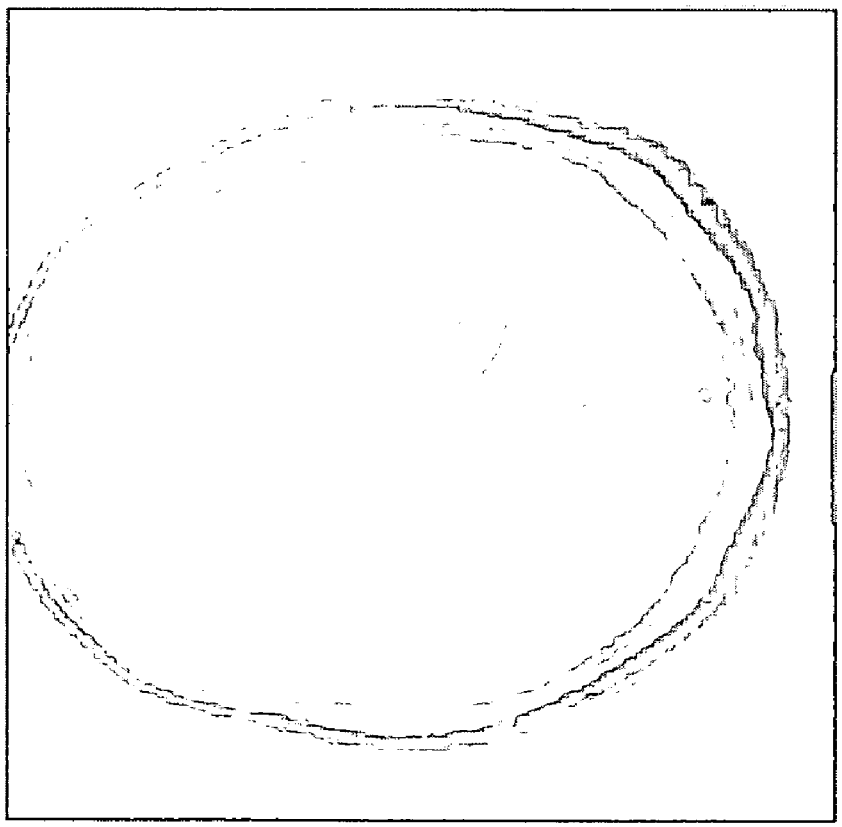
FIG. 10B
FIG. 10A

FIG. 11A
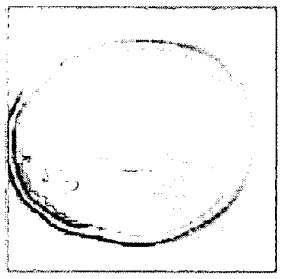</br>FIG. 11B
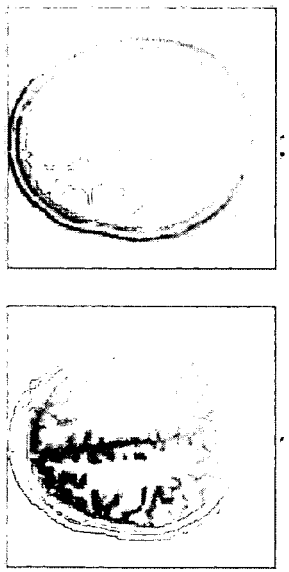</br>FIG. 11C
FIG. 11D
</br>FIG. 11E
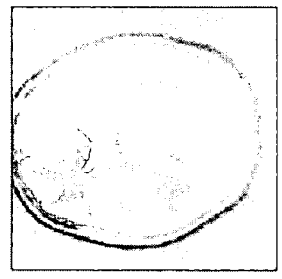</br>FIG. 11F
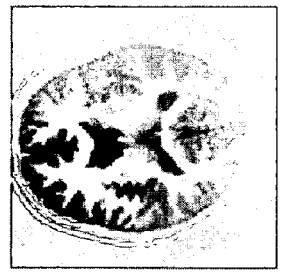</br>FIG. 11G
</br>FIG. 11H
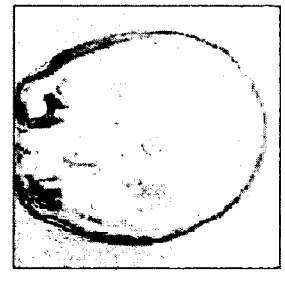</br>FIG. 11I
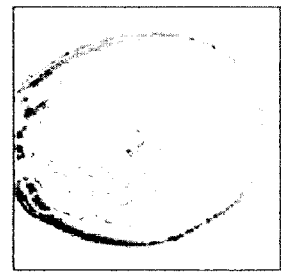</br>FIG. 11J
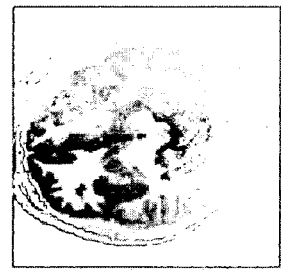</br>FIG. 11K
</br>FIG. 11L FIG. 14A 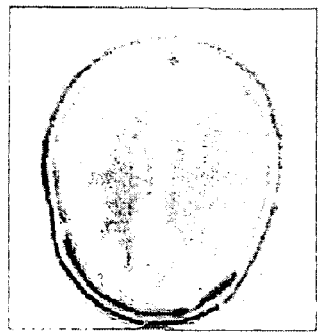 FIG. 14B 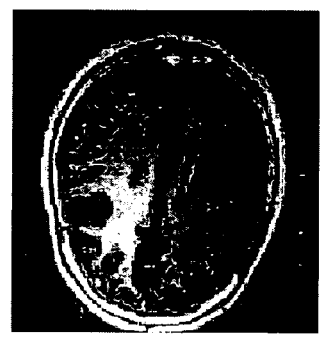
 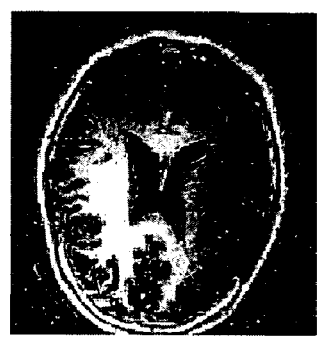 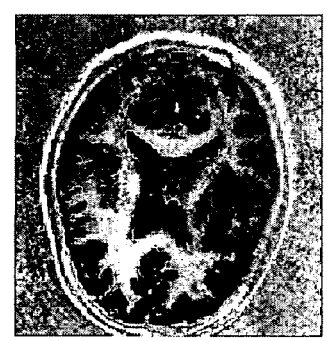
FIG. 14C  FIG. 14D  FIG. 14E
FIG. 15A 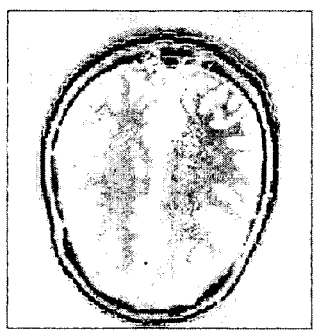 FIG. 15B 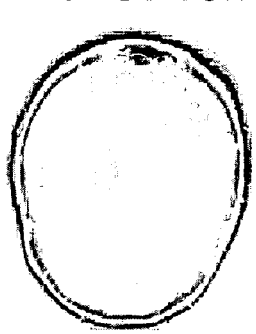
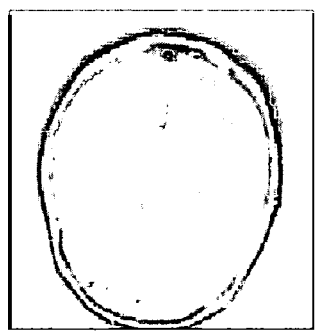  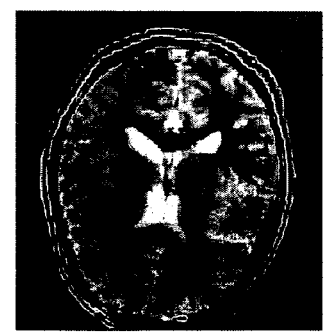
FIG. 15C  FIG. 15D  FIG. 15E

METHOD AND APPARATUS FOR PHASE-SENSITIVE MAGNETIC RESONANCE IMAGING

This patent application claims priority to, and the benefit of U.S. Provisional Patent Application Ser. No. 60/525,143 filed on Nov. 26, 2003, incorporated herein by reference in its entirety.

BACKGROUND OF THE INVENTION

1. Field of the Invention

The invention relates generally to the field of medical imaging. More particularly, the invention relates to phase sensitive magnetic resonance imaging using an efficient and robust image processing algorithm.

2. Discussion of the Related Art

Magnetic resonance imaging (MRI) has proven useful in the diagnosis of many diseases such as hepatic steatosis, cancer, multiple sclerosis, sports related injury, and bone marrow disorders. MRI provides unique imaging capabilities which are not attainable in any other imaging method. For example, MRI can provide detailed images of soft tissues, abnormal tissues such as tumors, and other structures which cannot be readily imaged using techniques like X-rays. Further, MRI operates without exposing patients to ionizing radiation experienced in X-rays. For these and other reasons, MRI is commonly utilized in the medical field.

In comparison to other imaging modalities, MRI is unique in that the MRI signal is represented by a complex number, rather than simply a scalar (such as X-ray attenuation in CT). The image value for each image pixel, therefore, usually includes a magnitude and a phase. Although the phase of an image pixel may carry important information and may be used in many applications such as chemical shift imaging, thermal imaging, and blood flow quantization, it is usually discarded in the standard image reconstruction process. The underlying reason is that some unwanted error phase almost always accompanies the desired phase. Although many methods have been developed to remove the error phase, a truly reliable and automated phase correction method is still lacking.

One application for phase correction of MR images includes inversion recovery imaging. Inversion recovery (IR) is generally used as a magnetization preparation technique in MRI. In IR imaging, the longitudinal magnetization along the main magnetic field is first rotated to the opposite direction using a 180° radiofrequency (RF) pulse. The inverted magnetization can be recovered by T1 relaxation during an inversion time (TI) between the inversion and the excitation RF pulses. One example application of the IR imaging is for suppression of a given type of tissue with a characteristic T1, such as short-tau inversion recovery (STIR) for fat suppression or fluid-attenuated inversion recovery (FLAIR) for cerebral spinal fluid attenuation. Another example application of IR imaging is for increased tissue contrast from the doubling of the dynamic range of the longitudinal magnetization. The application could be useful for imaging of neonate brains, myocardium at delayed enhancement, and for evaluating pulmonary blood flow. The potential for increased tissue contrast by IR imaging, however, is not always realized because conventional MR image reconstruction preserves only the magnitude of the MR signals and may actually lead to reduced or even reversed contrast in an IR image.

Phase-sensitive IR (PSIR) image reconstruction, in which unwanted phase errors in an IR image are removed, is a technique that can restore the contrast loss or reversal resulting from conventional magnitude image reconstruction. The main challenge in PSIR image reconstruction is a phase-correction process to separate the intrinsic signal phase in the complex image from other phase errors, which are common in an MR image. Several approaches have been proposed for PSIR image reconstruction including calibration of the phase errors through acquisition of another image without IR or with IR at different TIs. However, these approaches reduce data acquisition efficiency. Further, spatial misregistration between the actual and calibration scans due to patient motion can also be problematic.

An alternative approach for PSIR image reconstruction is to determine the phase errors from the IR image itself using various phase correction algorithms. In general, only the signal phase of a neighbor pixel for overall phase correction is used. As such, pixels with large phase variation, such as in regions of low signal-to-noise ratio (SNR) or along tissue boundaries may corrupt the phase correction process. In order to minimize the effect, an empirical threshold is usually selected to exclude regions of large phase uncertainty. The actual threshold value, however, can be critical. If the value selected is too small, phase correction cannot reach beyond the regions defined by the threshold value and may thus be terminated prematurely. Alternatively, if the value selected is too large, errors in phase correction may propagate and even corrupt the rest of the process. In a region growing-based approach, for example, the selection of the threshold value together with that of the initial seed and the path of the region growing, determines the quality and the scope of the phase correction. To allow phase correction to proceed beyond local phase fluctuations and to avoid potential corruption due to phase correction errors, an additional special treatment, such as a "bridge filter" is required. Another limitation of the phase correction algorithms is the global polarity of a PSIR image, which cannot be unambiguously determined from the phase correction process itself. Consequently, images from different component channels of a phased array coil cannot be readily combined and inconsistency in display may arise for different images of a multi-slice acquisition.

Another application where correction of phase errors is important is the Dixon chemical shift imaging technique. In MRI, the signal-emitting protons may resonate at different Larmor frequencies because they have different local molecular environments or chemical shift. The two most distinct species found in the human body are water and fat, whose Larmor frequencies are separated by about 3.5 ppm (parts per million). In many clinical MRI applications, it is desirable to suppress signals from fat because they are usually very bright and obscure lesions. Presently, the most commonly used method for fat suppression is chemical shift selective saturation (CHESS), which, despite its many advantages, is known to be intrinsically susceptible to both the radiofrequency (RF) and the magnetic field inhomogeneity. Another technique that is sometimes used for fat suppression is the short tau inversion recovery (STIR), which is based on the characteristically short T1 relaxation constant for fat, rather than on its Larmor frequency. The drawbacks of STIR include reduction in scan efficiency and signal-to-noise ratio as well as potential alteration to the image contrast.

The referenced need for phase corrections in MRI and shortcomings of some of the existing approaches are not intended to be exhaustive, but rather are among many that tend to impair the effectiveness of previously known techniques concerning image reconstruction; however, those mentioned here are sufficient to demonstrate that the methodologies appearing in the art have not been satisfactory and that a significant need exists for the techniques described and claimed in this disclosure.

SUMMARY OF THE INVENTION

The present invention provides a method for phase-sensitive MRI to separate the intrinsic signal phase from a coexistent error phase, which could be due to field inhomogeneity or other system imperfections. For many applications, such as the Dixon chemical shift imaging and the phase sensitive inversion recovery imaging, the error phase usually varies slowly in space from pixel to pixel. The intrinsic phase, on other hand, is determined by the tissue distribution and could have sudden spatial changes.

In one respect, a method is provided. The method includes steps for acquiring a plurality of MRI data signals and forming complex images from the data signals. In some embodiments, the data may be acquired from multiple slices and multiple receiver coils. Further, a pulse sequence and a partially parallel imaging technique, such as a sensitivity encoding (SENSE) technique may be performed to acquire the data. The data may be an opposed-phase echo and an in-phase echo of a first and second signal data. In some embodiments, the opposed-phase echo and an in-phase echo may be acquired by performing a gradient-echo dual-echo sequence (e.g., a two-dimensional gradient-echo dual-echo sequence or a three-dimensional gradient-echo dual-echo sequence). In other embodiments, the opposed-phase echo and an in-phase echo may be acquired by performing a two-dimensional spin echo pulse sequence. Alternatively, the opposed-phase echo and an in-phase echo may be acquired by performing a fast spin echo sequence (e.g., a two-dimensional sequence or three-dimensional fast spin echo sequence).

In some respects, the data may be acquired from an inversion recovery pulse sequence. The data may be acquired from an inversion recovery fast spin echo sequence (e.g., two-dimensional sequence or three-dimensional fast spin echo sequence). Alternatively, the data may be acquired from an inversion recovery two-dimensional or three-dimensional gradient echo sequence.

In other respects, the data may be acquired from a one-point Dixon echo which includes water and fat signals. In one embodiment, the one-point Dixon data may be acquired from a gradient-echo sequence (e.g., two-dimensional or three-dimensional gradient-echo sequence). In other embodiments, the one-point Dixon data may be acquired by time-shifting conventional spin echo, such a as in a two-dimensional spin echo sequence. Alternatively, the one point Dixon data may be acquired from a two-dimensional or three-dimensional fast spin echo sequence.

The method may also include a phase-correction algorithm that may be implemented by first calculating two images of phase-gradients ($D_x$ and $D_y$) along a first and second axis using a complex image. In the case of phase sensitive IR imaging, the image may be a square of the complex image that may be obtained directly by fast Fourier transform of the acquired data for each receiver coil and each slice. In the case of a two-point Dixon chemical shift imaging, the complex image may be a square of a processed image summed from all the receiver coils. The processed image may be a product of the magnitude of the in-phase image and the ratio of the opposed-phase image over the in-phase image. These phase gradients, together with a series of pixel stacks that may initially be empty, may be used to help select an optimal growth path in a region growing process. Next, the region-growing process is performed for calculating a phase vector image for the phase correction.

The method may further comprise selecting an initial seed pixel from the image and evaluating the four pixels immediately neighboring the initial seed pixel. Each of the four pixels are sorted and placed within a corresponding pixel stack based on the individual phase gradient value of each pixel in reference to the initial seed pixel. After the four pixels are sorted, the initial seed pixel may be assigned a variable representing its direction of the phase vector.

The region-growing process proceeds by selecting a subsequent seed pixel from a pixel stack that is not empty and stores pixels with the lowest $D_x$ or $D_y$ range value. The four nearest neighbor pixels of the subsequent seed pixel, excluding the ones that have previously been placed into the pixel stacks, are placed into one of the pixel stacks according to their phase gradient value with respect to the new seed pixel. The phase vector of the subsequent seed pixel is determined from an estimated direction for the phase vector based on the amplitude and the phase for a group of pixels that lie within a neighboring area (such as defined by a boxcar) centered at the subsequent seed pixel. The region-growing process will continue until all the pixels have been chosen as a seed pixel, or equivalently, until all the pixel stacks are empty.

After the region growing and the phase error determination, simple algebraic calculations will yield a fat-only image and a water-only image in the case of Dixon chemical shift imaging. Alternatively, phase sensitive inversion recovery image can be taken as the real part of a phase corrected inversion recovery image. These images may then be displayed or archived using output and storage devices.

The method may also provide steps for maintaining polarity consistency of the phase-corrected inversion recover image or for maintaining consistency for water and fat identification for two-point Dixon chemical shift imaging. In one embodiment, the method provides steps for calculating a coil-correlation index for polarity consistency among different coils. In other embodiments, the method provides steps for calculating a slice correlation index for polarity consistency or for consistency for water and fat identification among different slices. In addition, the method may provide steps for calculating a moment of inertia for determining a correct polarity for images from multiple slices. Alternatively, the method may provide steps for utilizing image intensity histogram information for correct identification of water and fat images from multiple slices.

In some respects, a system is provided. The system includes a magnetic resonance imaging (MRI) scanner capable of running a pulse sequence such as a fast gradient-echo dual-echo sequence, a controller, and an output device. The MRI scanner may be adapted to provide a plurality of data signals following a scan. Using a pulse sequence such as the fast gradient-echo dual-echo pulse sequence, a plurality of data signals may be produced, collected, and sent to the controller for processing. The controller receives the data signals and implements a phase correction algorithm such as for the two-point Dixon chemical shift imaging processing to produce an image (e.g., a water-only image, a fat-only image, etc). To correct phase errors such as local field inhomogeneity, a phase-correction algorithm may be implemented by the controller. First, the phase gradient between neighboring pixels within an image may be calculated. Next, a region-growing process is performed. An initial seed pixel is selected and placed onto one of a plurality of pixel stacks. The initial seed pixel is then assigned a phase vector for a phase correction scheme and subsequently taken out of the pixel stack. The four pixels immediately surrounding the initial seed pixel are then evaluated and each of the four pixels is in turn placed into a corresponding pixel stack dependent on its phase gradient value in reference to the initial seed pixel. In the next round of the region growing, a pixel that sits in a pixel stack that covers the smallest phase gradient value is selected as a new seed pixel. Its four nearest neighbor pixels, except those that have already been placed onto the pixel stacks, are then placed onto one of a plurality of pixel stacks according to their phase gradient value in reference to that of the new seed pixel. The phase vector of the new seed is determined from an estimated value, which in turn is determined by the amplitude and the phase of the surrounding pixels that lie within a certain neighborhood of the seed pixel, and that have been previously chosen as a seed pixel.

In other respects, a system including a MRI scanner and a plurality of coils is provided. A controller, coupled to the MRI scanner, may receive data from the plurality of coils and multiple slices and may initiate and perform a phase correction algorithm. In one embodiment, the controller may form complex images from the data and may initiate and perform a region growing algorithm to correct the phase errors. Upon correcting the phase errors, the controller may reconstruct phase-corrected images.

These and other embodiments of the invention will be better appreciated and understood when considered in conjunction with the following description and the accompanying drawings. It should be understood, however, that the following description, while indicating various embodiments of the invention and numerous specific details thereof, is given by way of illustration and not of limitation. Many substitutions, modifications, additions and/or rearrangements may be made within the scope of the invention without departing from the spirit thereof, and the invention includes all such substitutions, modifications, additions and/or rearrangements.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore nonlimiting, embodiments illustrated in the drawings, wherein like reference numerals (if they occur in more than one view) designate the same elements. The invention may be better understood by reference to one or more of these drawings in combination with the description presented herein. It should be noted that the features illustrated in the drawings are not necessarily drawn to scale.

FIG. 3A is a portion of an image and illustrates the initiation of the region-growing process in accordance with an embodiment of the present invention.

FIG. 3B is a plurality of pixel stacks and the placement of pixels over time in accordance with an embodiment of the present invention.

FIG. 4A is a histogram of a fat-only image in accordance with an embodiment of the present invention

FIG. 10A shows sum-of-square images of FIGS. 9A–9H after checking the coil correlation indices in accordance with an embodiment of the present invention.

FIG. 10B shows the sum-of-square image of the same slice of FIGS. 9A–9H from the coils using conventional magnitude image reconstruction.

FIGS. 11A–11L show a series of images after phase correction of twelve consecutive slices for one coil in accordance with an embodiment of the present invention.

FIGS. 14A–14E show a series of images with different polarities from different slices of one coil in accordance with an embodiment of the present invention.

FIGS. 15A–15E show a series of images of FIGS. 14A–14E with consistent but incorrect polarities in accordance to embodiments of the present invention.

DETAILED DESCRIPTION

The invention and the various features and advantageous details are explained more fully with reference to the nonlimiting embodiments that are illustrated in the accompanying drawings and detailed in the following description. Descriptions of well known starting materials, processing techniques, components and equipment are omitted so as to unnecessarily obscure the invention in detail. It should be understood, however, that the detailed description and the specific examples, while indicating preferred embodiments of the invention, are given by way of illustration only and not by way of limitation. Various substitutions, modifications, additions, and/or rearrangements within the spirit and/or scope of the underlying inventive concept will become apparent to those skilled in the art from this disclosure.

The present invention includes a method and apparatus for phase sensitive magnetic resonance imaging using an efficient and robust phase correction algorithm. The application used for illustration here is the 2PD (2-point Dixon) technique with a commercially available fast gradient-echo dual-echo data acquisition system and a phase-correction algorithm to produce higher resolution images taken from an MRI scan. In other embodiments, the phase correction algorithm may be used in applications such as one-point Dixon (1PD) techniques, three-point Dixon (3PD) techniques, and phase sensitive inversion recovery imaging, among other things. For the Dixon chemical shift imaging, the phase correction algorithm may be applied to data collected with other types of pulse sequences, such as regular spin echo pulse sequence and fast spin echo pulse sequences. The data collected may be from a two-dimensional acquisition or from a three-dimensional acquisition. Alternatively, the data may be acquired with partially parallel imaging techniques such as the sensitivity encoding (SENSE) technique. In one specific embodiment of the invention, after the reconstruction of the images, a method is provided for correcting any phase errors that may arise as a result of field inhomogeneity or other system imperfections. The phase-correction algorithm consists of a region growing process, where the growth path follows the maximum angular smoothness or minimum phase gradient. Further, the direction for the phase vector of each of the pixels may be determined from an estimated direction using both the amplitude and the phase of the phase vectors of those already determined and that are located within a neighboring area, such as an area defined by a boxcar, centered at a pixel under consideration.

Figure 1:
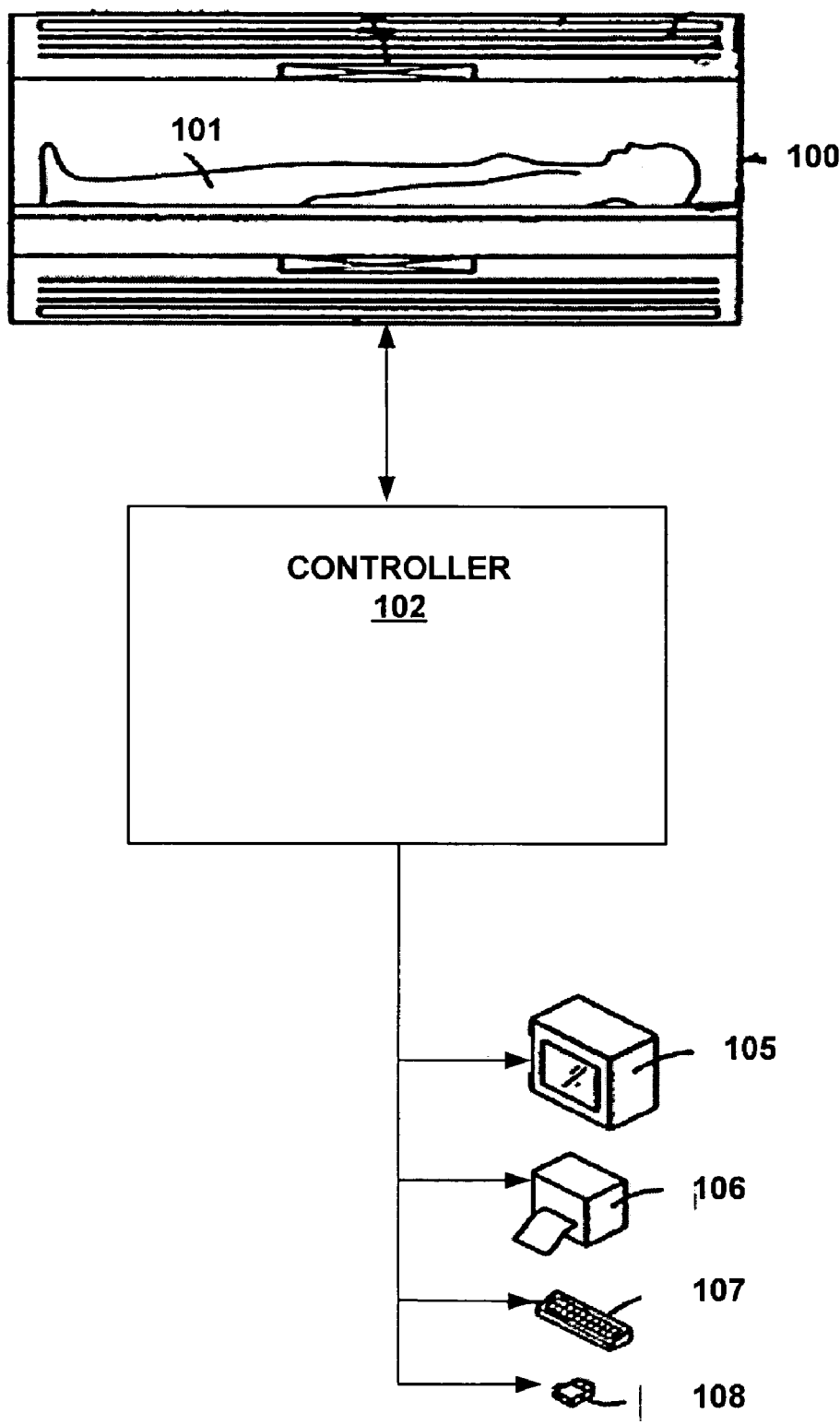
FIG. 1 illustrates an MRI imaging system in accordance with an embodiment of the present invention.

In FIG. 1, an MRI apparatus, in accordance with an embodiment of the present invention, is presented. The MRI apparatus includes a scanner 100, a controller 102, output devices such as a display screen 103, an output printing device 104, and input devices such as a keyboard 105 and a mouse 106.

Figure 2:
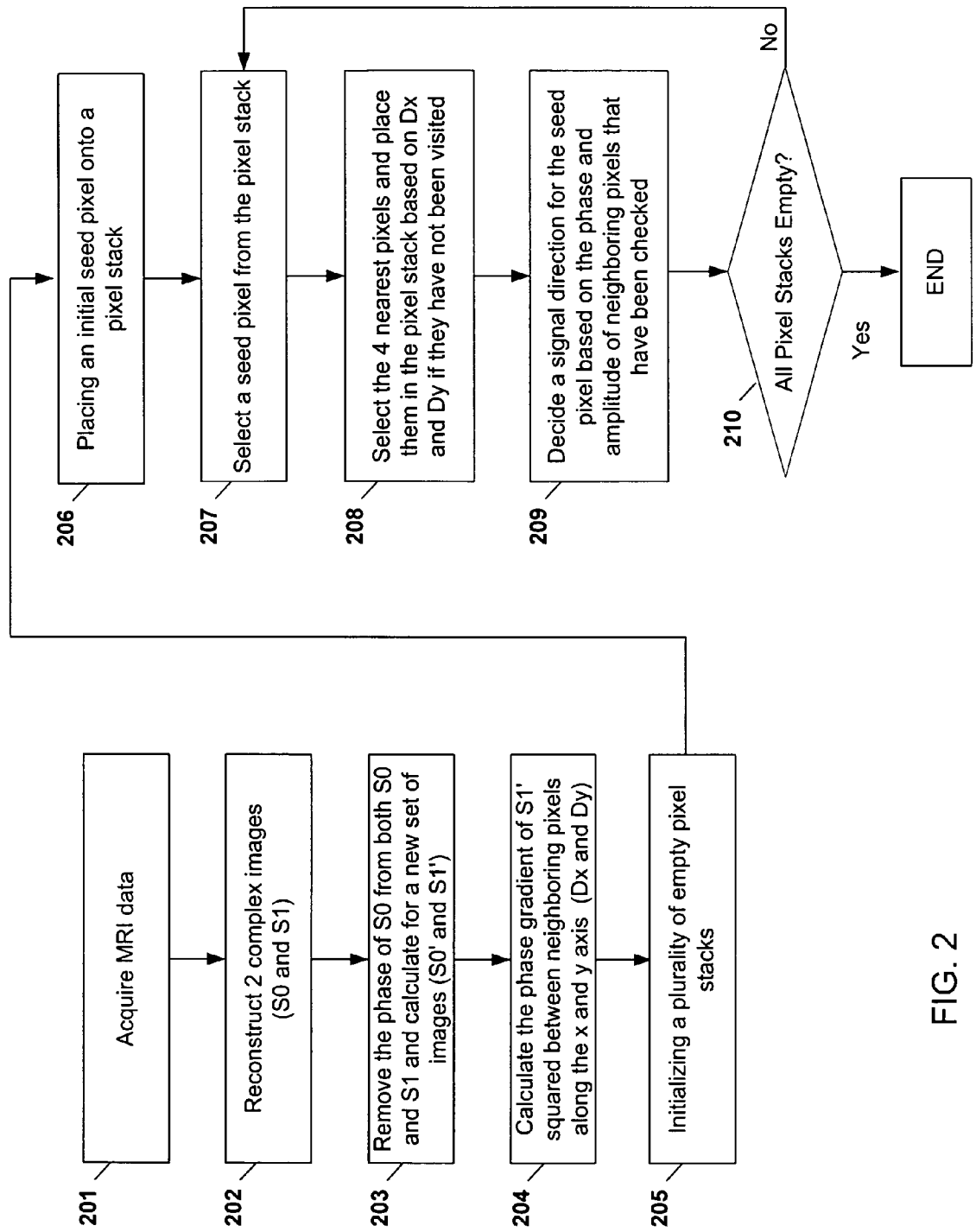
FIG. 2 is a flowchart showing steps of a method in accordance with an embodiment of the present invention.

To obtain an image, a patient 101 is placed inside a scanner 100, which receives instructions about generating image data from the controller 102. The controller 102 obtains the data, processes the data to obtain desired image(s), and outputs the final image(s) to an output device of choice, such as a display monitor 103 or a printer 104. One of the various methods that may be utilized by the controller 102 is shown in FIG. 2. The controller 102 may also receive user input from input devices such as a keyboard 105 or a mouse 106, which dictates the type of images that are taken of the patient 101.

A flowchart showing the steps of an embodiment of the present invention is given in FIG. 2. In step 201, MRI image data is obtained from a subject after the scanning process. In one embodiment, a commercially available fast gradient-echo dual echo may be used for data acquisition. Two gradient echoes with water and fat signals in-phase and opposed-phase may be collected within the same phase repetition time. The echo time (TE) for acquiring the in-phase image may be approximately 4.6 milliseconds (ms) and the echo time difference between the in-phase image and the opposed-phase image may be approximately 2.3 ms when the magnetic field strength is approximately 1.5 Tesla. It is noted that other echo times may be used, depending on the application and system configuration. As such, the advantages of fast gradient-echo dual-echo acquisition without interleave may minimize scan time and patient motion, allowing for a single breath hold examination of the entire abdomen. Further, the complete elimination of patient respiratory motion or slice misregistsration artifacts may be obtained utilizing the efficient data acquisition method.

Steps 202 and 203 of FIG. 2 comprise an image reconstruction scheme. In one embodiment, the two images corresponding to the dual echoes may first be reconstructed using a fast Fourier transform. Ignoring the tissue relaxation, the in-phase and opposed-phase images, respectively, may be expressed as $$S_0(m,n)=(W+F)e^{i\Phi_0} \qquad \text{Eq. 1}$$

$$S_1(m,n)=(W-F)e^{i(\Phi_0-\Phi)} \qquad \text{Eq. 2}$$

(step 202). The water and fat contents in a given pixel are represented by W and F, respectively, m represents the index for the pixel location along the x-axis, and n represents the index for the pixel location along the y-axis. $\Phi_0$ may be a phase of the image $S_0(m,n)$, which includes the phase due to the field inhomogeneity and a static phase that may arise from the RF penetration and signal delay in the receiver chain. $\Phi$ represents an additional phase due to the field inhomogeneity accumulated during the time difference between the first and second echo acquisitions.

In order to solve for the water and fat content within a pixel, the phase factors due to $\Phi_0$ and $\Phi$ may be eliminated using Eqs. 1 and 2 (step 203). Equations 1 and 2 may be rewritten as:

$$S_o'(m,n)=S_o(m,n)e^{-i\Phi_0}=W+F \qquad \text{Eq. 3}$$

$$S_1'(m,n)=S_1(m,n)e^{-i\Phi_0}=(W-F)e^{-i\Phi} \qquad \text{Eq. 4}$$

in which $e^{-i\Phi_0}$ may be determined by the ratio of the magnitude of the image $S_0$ over the image itself where $$e^{-i\Phi_0}=|S_0(m,n)|/S_0(m,n) \qquad \text{Eq. 5}$$

In the presence of field inhomogeneity, however, $\Phi$ is not zero, and thus, the determining of $\Phi$ is challenging. From Eq. 4, $\Phi$ may not solely depend on the phase of the signal $S_1'$ because the latter also depends on whether water or fat is dominant for a given pixel.

Most previous methods for eliminating the ambiguity in 2PD processing have determined $\Phi$ with either an explicit or an implicit phase unwrapping which determines the true phase of a complex variable from its derived modulo $2\pi$ value. A common feature of these methods is the phase correction for a given pixel may be performed solely on the basis of the phase of a neighboring pixel. In an actual MR image, regions of large phase uncertainty due to low signal or artifacts always exist. To accommodate for these situations, selection of an empirical angular threshold is usually required in these methods and, as previously mentioned, difficulties arise in choosing the optimal threshold.

In steps 204–210, a phase correction algorithm may be implemented to determine a phase vector ($e^{-i\Phi}$). In accordance to the present invention, the phase vector may be a unit vector, where the direction of the phase vector may be defined by the phase $\Phi$ due to the local field inhomogeneity. Given Eq. 3 and Eq. 4, determining the phase vector without determining the phase $\Phi$ may be sufficient for unambiguous water and fat separation.

Since (W–F) of Eq. 4 of a given pixel may be either positive or negative depending on whether water or fat is dominant in the pixel, Eq. 4 may be rewritten as:

$$e^{-i\Phi}=\pm S_1'(m,n)/|S_1'(m,n)| \qquad \text{Eq. 6}$$

The phase vector may therefore be either parallel or antiparallel to the direction determined by the signal $S_1'$. After determining $S_1'$, the phase vector may be dependent on the selection of either $S_1'$ or $-S_1'$ as the true phase representation of the phase vector. The selection of $S_1'$ or $-S_1'$ may be made in a region-growing process by recognizing that the direction of the phase vector varies smoothly and usually slowly from pixel to pixel. Further, with the exception of strong artifact pixels, the phase of the pixel with large amplitude may be better defined than that of one with small amplitude.

Before initiating and performing the region-growing process, a phase gradient between neighboring pixels for the phase due to $e^{-i\Phi}$ in Eq. 4 may be calculated (step 204). In one embodiment, an image of the phase gradient between neighboring pixels along the x-axis may be expressed as:

$$D_x(m,n) = |\arg([S_1'(m,n)]^2 \cdot [S_1'(m+1,n)]^{2*})| \quad \text{Eq. 7}$$

in which arg( . . . ) and * denote taking the argument and the complex conjugate of a complex variable, respectively. Similarly, $D_y(m,n)$, an image of phase gradient between neighboring pixels along the y-axis may be calculated. Normally, the arg( . . . ) operation generally yields an angular range between $-\pi$ and $\pi$, however, both $D_x$ and $D_y$ may be within the 0 to $\pi$ range because of the magnitude operation in Eq. 7. It is noted that the square of $S_1'(m,n)$ (as given in Eq. 7) may eliminate the potentially sudden phase change due to the W and F terms. As such, $D_x(m,n)$ and $D_y(m,n)$ represent the phase gradient due only to the phase vector $e^{-i\Phi}$.

Before initiating the region growing process, the present phase correction method may also establish a series of pixel stacks (step 205). Each pixel stack may be used to cover an incremental segment of the total angular range for $D_x(m,n)$ and $D_y(m,n)$, which ranges between 0 to $\pi$. In one embodiment, the pixels stacks may initially be all empty. The total number of pixel stacks may vary, but in general, covers the angular range with sufficient resolution. For example, 18 pixel stacks would allow each pixel stack to cover 10°, which may be sufficient in many applications.

The initiation of the region-growing process begins with selecting an initial seed pixel. In one embodiment, the initial seed pixel may be selected randomly or may simply be the center pixel of the image. Alternatively, the initial seed pixel may be selected based on a predetermined criterion, such as selecting a pixel with the maximum intensity (refer to FIG. 4A and FIG. 4B) or as the pixel with the minimum value of $D_x(m,n)$ or $D_y(m,n)$. In one embodiment, the initial seed pixel may be selected and subsequently placed onto a pixel stack (step 206). As such, the region-process may look to the pixel stacks and select a seed pixel from the stack (step 207).

In order to indicate the selection of the initial seed, a mask may be provided, in which for every pixel, a value may be stored to indicate if the pixel has been selected. Therefore, for every pixel that is selected or "visited", a value such as "1" may be assigned within the mask. Further, the region-growing process proceeds with the selection of the four nearest pixels surrounding the initial seed pixel. Each of the four pixels may also be marked as "visited" by assigning a value, e.g., "1" in the mask to indicate the selection of the four pixels. In one embodiment, after the selection of the four nearest neighboring pixels, each of the four pixels may be sorted to pixel stacks according to the $D_x$ or $D_y$ value of each pixel calculated in step 204 (step 208). For example, since the value of $D_x$ and $D_y$ may range between 0 and $\pi$, eighteen pixel stacks may be used in which each stack represents a range of $D_x$ or $D_y$ value of $\pi/18$ (i.e., 10°). A pixel with a $D_x$ or $D_y$ value between 0° and 10° may be placed in stack 1. Similarly, a pixel with a $D_x$ and $D_y$ value between 21° and 30° may be placed in stack 3. Referring to FIGS. 3A and 3B, initial seed pixel labeled "A" is located at $(x_0, y_0)$ in image 300. After the selection of initial seed pixel, the initial seed pixel may be stored in pixel stacks 301, for example, pixel stack 1. However, since the seed pixels may be subsequently assigned a new phase correction value and deleted from the stack, the seed pixel may be randomly placed into any of the pixel stack. The four pixels immediately surrounding pixel "A" are pixels "B", "C", "D", and "E". Each of these four pixels are successively visited and placed within pixel stacks 301 depending on the $D_x$ or $D_y$ value. For example, the phase gradient value, $D_x$, between pixel "A" and pixel "B" may be 21°. Therefore, pixel "B" may be placed in pixel stack "3" representing the phase gradient range of 21° and 30°. When the four pixels surrounding the initial seed pixel have been sorted, the $S_1'$, value of the seed pixel may be assigned a new variable, $S_{1\Phi}'$, representing the direction of the phase vector (step 209). The seed pixel may then be marked as "checked" by assigning a value in a mask. In one embodiment, the signal direction of the seed pixel may be determined using the phase and amplitude of neighboring pixels that have been checked. After a pixel is marked "checked" and has been assigned a new phase direction, the pixel may subsequently be removed from the stack.

In subsequent steps for the region growing process, the next seed pixel may be selected from one of the pixel stacks (steps 207). In one embodiment, the next seed pixel may be selected from the pixel stack representing the lowest $D_x$ and $D_y$ value range and that is not empty. Referring again to FIG. 3B, the pixel stack 301 may have pixel stacks "1" through "N". The lowest pixel stack representing the lowest $D_x$ and $D_y$ value is pixel stack 1. However, since pixel "A" may be subsequently removed after assigning a new phase vector value, the next pixel stack that represents the lowest $D_x$ and $D_y$ value is pixel stack 2. Pixel stack 2 is not empty and currently stores pixel "E". As with the initial seed pixel, the four pixel surrounding the seed pixel, except for those with a marker indicating "visited" may be assigned a value corresponding to the selection within a mask and may be sorted to pixel stacks according to the respective $D_x$ and $D_y$ value. Referring to FIG. 3A, since pixel "E" is the new seed pixel, the four seed pixels surrounding "E" will be sorted into pixel stacks. However, since pixel "A" has been masked as having been visited, the region-growing process skips pixel "A" and sorts pixel "F", "G", and "I" accordingly. To determine the direction of the phase vector of the new seed pixel, an estimated value, $S_{1e}'$ may be calculated on the basis of the pixels that are marked as "checked" and located within the neighborhood of the new seed pixel (step 209). A simple method of estimation may be expressed as:

$$S_{1e}'(i_0,j_0) = \Sigma S_{1\Phi}'(i,j) \cdot Chk(i,j) \quad \text{Eq. 8}$$

in which $(i_0, j_0)$ represents the indices for the location of the new seed pixel, and the summation is performed over a small boxcar region (e.g., 7×7 pixel area) that may be centered at the new seed pixel. In another embodiment, the local linear phase components that may be present in $S_{1\Phi}'$ may also be corrected for a more accurate estimation as follows:

$$S_{1e}'(i_0,j_0) = \Sigma S_{1\Phi}'(i,j) \cdot e^{-ia_x(i-i_0)} \cdot e^{-ia_y(i-i_0)} Chk(i,j) \quad \text{Eq. 9}$$

where $a_x$ and $a_y$ are the local linear phase slopes along x and y directions respective and may be determined as follows:

$$a_x = \arg\{\Sigma S_1'(i,j)S_1'^*(i+1,j)\} \qquad \text{Eq. 10}$$

$$a_y = \arg\{\Sigma S_1'(i,j)S_1'^*(i,j+1)\} \qquad \text{Eq. 11}$$

where $S_1'$ is given by Eq. 4, and the summation may be performed over a local region (e.g., defined by a boxcar) centered at the seed pixel. Once $S_{1e}'$ is determined, the direction of $S_{1\Phi}'$ and $S_1'$ may be compared. If the directional difference between $S_{1e}'$ and $S_1'$ is less than $\pi/2$, $S_{1\Phi}'$ takes the value of $S_1'$. Otherwise, $S_{1\Phi}'$ takes the value of $-S_1'$. Note that the esti of $S_{1e}'$ that may be used to determine the direction of phase vector for the seed pixels may be calculated using both the amplitude and the phase contained in $S_{1\Phi}'$ of the neighboring pixels that have been visited. The pixels that have lower signal amplitudes may be expected to have large phase fluctuations. Because of the use of the amplitude weighting, those pixels may have less contribution to the estimation than the pixels with larger amplitudes. For this reason, the estimated direction becomes less susceptible to noise fluctuations than previous methods using only the signal phase as a reference. The entire region growing process continues (steps 207–210) until all pixel stacks are empty or until every pixel in the image is marked "checked".

After the region-growing process, $S_{1\Phi}'$ may be used to directly calculate the phase vector for phase correction in Eq. 4. However, in one preferred embodiment, two additional processing steps may be performed for optimization. The first step may be to correct for pixels that are erroneously determined during the region-growing process. One method of correction may be to average $S_{1\Phi}'$ within a boxcar, for example, 7×7 pixel area with the pixel located at the center of the boxcar. The averaged $S_{1\Phi}'$ may subsequently be compared with the original $S_{1\Phi}'$. If the directional difference between the averaged $S_{1\Phi}'$ and the original $S_{1\Phi}'$ is greater than $\pi/2$, the original $S_{1\Phi}'$ for the pixel may be replaced with $-S_{1\Phi}'$. Otherwise, $S_{1\Phi}'$ may retain its original value.

The second step may be implemented for pixels with low signals and artifacts in which the phase of $S_{1\Phi}'$ may be subject to substantial uncertainty. As a consequence, even the correctly determined $S_{1\Phi}'$ may not be the optimal representation of the direction of the phase vector that is actually due to the field inhomogeneity. To resolve this problem, another average of $S_{1\Phi}'$ may be calculated using a pixel area boxcar such as a 7×7 pixel area with the pixel at the center of the boxcar. Instead of using $S_{1\Phi}'$, the averaged $S_{1\Phi}'$ may be used to determine the phase vector and subsequently may be used to calculate the final phase correction in Eq. 4. The advantage of using the averaged $S_{1\Phi}'$ for the phase vector is the phase fluctuation may effectively be minimized for low signal-to-noise ratio regions without affecting the spatial resolution of the final images.

The fat and water signals acquired from the imaging process may be symmetrical, i.e., the two signals are either parallel or anti-parallel. Thus, using only the phase information, it is only possible to separate the water and fat. Without correctly identifying the separated image, water and fat images from different slices may likely be mixed up. In order to correct for such possibilities, the correlation among different slices may be employed by calculating two slice correlation indices:

$$SCI^{(-)} = \sum_{(i,j)} |S_{1\phi}'(i,j,k) - S_{1\phi}'(i,j,k+1)|. \qquad \text{Eq. 12}$$

$$SCI^{(+)} = \sum_{(i,j)} |S_{1\phi}'(i,j,k) + S_{1\phi}'(i,j,k+1)| \qquad \text{Eq. 13}$$

where k and k+1 may be used to indicate two spatially neighboring slices. Although the summation in both Eq. 12 and Eq. 13 may be performed over the entire image, the summation may also be performed over a selected region or regions of an image. In one example, the summation may be reduced to a single pixel with good signal to noise ratio. When water and fat identification between the images of the two slices is consistent, $SCI^{(-)}$ may be smaller than $SCI^{(+)}$ because the actual phase errors contained in $S_{1\Phi}'(i,j)$ may vary slowly in space. Similarly, if the water and fat identification for the two images of the two neighboring slices is inconsistent, $SCI^{(+)}$ may be smaller than $SCI^{(-)}$.

Figure 4B:
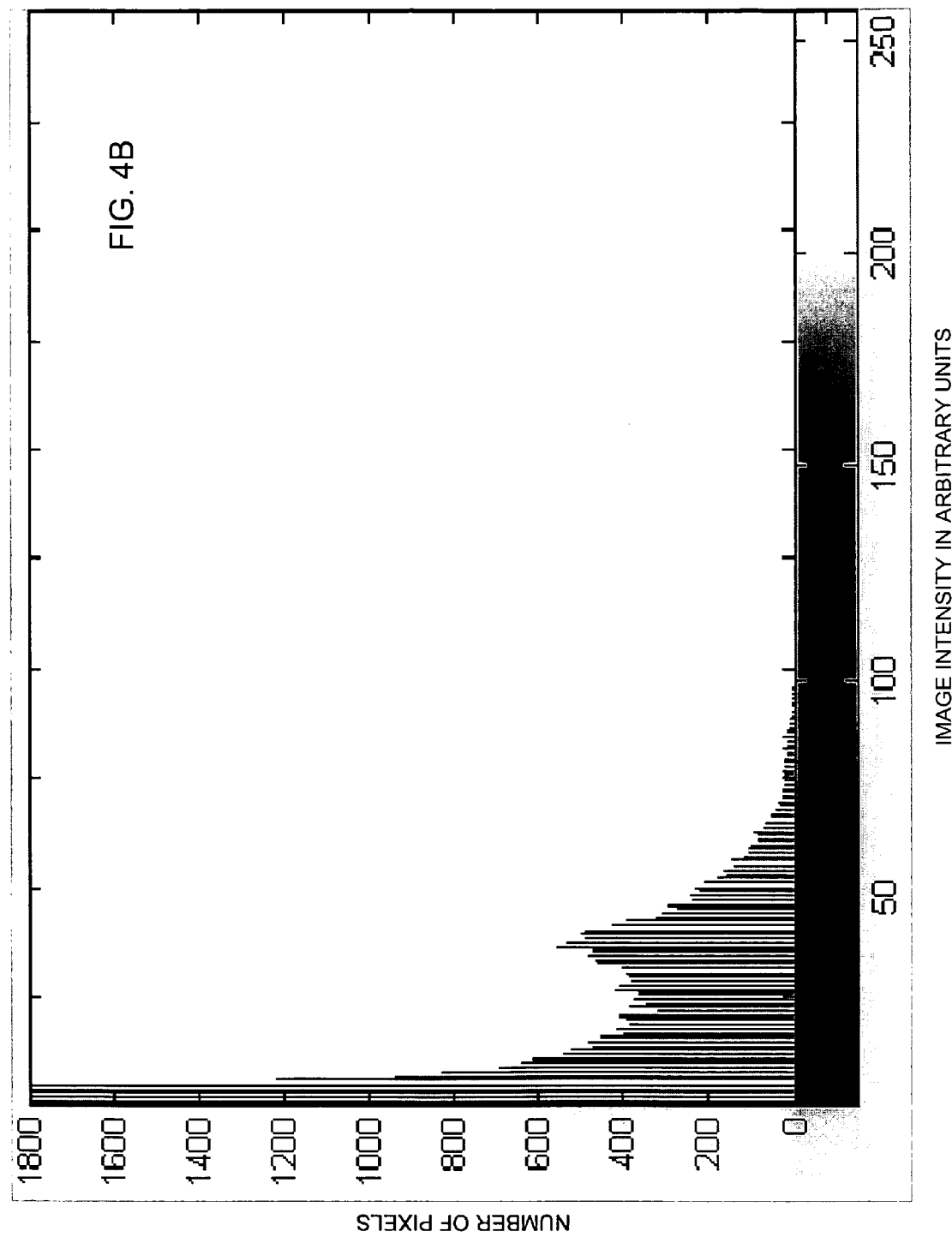
FIG. 4B is a histogram of a water-only image in accordance with an embodiment of the present invention.

In order to make a final identification of water and fat for the entire image set, additional information, such as the unique spectrum of the biological fat or an image pattern human eyes use for identification may be provided. For a given pulse sequence and a certain defined protocol, the images histogram may be conveniently used as well. FIGS. 4A and 4B show the image histograms of a water-only and fat-only image, respectively. It is evident in FIG. 4A that the fat-only image has a distribution of pixels with higher intensity than the water-only image. As such, it may be possible to identify a fat-only pixel. Alternatively, identification of fat or water pixels may also be based on selecting pixels with minimum phase gradients as determined in Eq. 6 or Eq. 7.

In another embodiment, for data acquired in multi-slice (e.g., two-dimensional or three dimensional) with multi-channel phased array receive coils and with an inversion recovery prepared pulse sequences, the images may be processed into phase sensitive inversion recovery image. A flowchart showing the steps of an embodiment of the present invention is given in FIG. 5. In step 501, an image from a slice and a receiver coil may be obtained via an inversion recovery (IR) prepared spin-echo or other pulse sequences. In some embodiments, multiple images may be obtained, where each of the images corresponds to a slice and receiver coil. In step 502, a complex image for the corresponding coil and slice may be reconstructed using fast Fourier Transform (FFT) prior to the phase correction. In one embodiment, the Fourier transform of the time-domain data corresponding to the $m^{th}$ slice and $n^{th}$ receiver coil, may be expressed as follows:

$$S_{m,n}(x,y) = I_{m,n}(x,y) e^{i(\Phi_{m,n}(x,y) + \theta_m(x,y))} \qquad \text{Eq. 14}$$

in which x and y are the spatial indices of a pixel for the two different dimensions of the image, $\theta_m(x,y)$, which may have a value of either 0° or 180°, may be the intrinsic signal phase determined by the sign of the longitudinal magnetization at the time of the excitation, and $\Phi_{m,n}'(x,y)$ may be the error phase, which varies with spatial locations. Possible sources of contribution to $\Phi_{m,n}'(x,y)$ may include complex RF receiver filters, miscentering of the data acquisition window, inadequate gradient compensation, B0-field inhomogeneity, and phase shifts due to RF receiver coils. $I_{m,n}(x,y)$ may be the image magnitude obtained in a conventional magnitude reconstruction. As noted above, the PSIR reconstruction may restore the intrinsic phase factor $e^{i\theta_m(x,y)}$ which is discarded with the error phase factor $e^{i\Phi_{m,n}(x,y)}$ in a conventional magnitude operation. Implicit in the above expressions, and used later for intercoil polarity determination, is that the intrinsic phase factor $e^{i\theta_m(x,y)}$ may be independent of the coil index n for a given image.

To separate the error phase factor $e^{i\Phi_{m,n}(x,y)}$, Eq. 14 may be rewritten as:

$$S_{m,n}(x,y)=S_{m,n}'(x,y)e^{i\Phi_{m,n}(x,y)} \qquad \text{Eq. 15}$$

in which $S_{m,n}'(x,y)$ represents the image that is desired in a PSIR image reconstruction with phase errors removed. Similarly, since $\theta_m(x,y)$ may have a value of either 0° or 180°, Eq. 14 may also be rewritten as:

$$S_{m,n}(x,y)=\pm S_{m,n}''(x,y) \qquad \text{Eq. 16}$$

in which $S_{m,n}''(x,y)$ represents the image which contains only the phase error factor $e^{i\Phi_{m,n}(x,y)}$ and excludes the intrinsic phase:

$$S_{m,n}''(x,y)=I_{m,n}(x,y)e^{i\Phi_{m,n}(x,y)} \qquad \text{Eq. 17}$$

The + and − signs in Eq. 16 may correspond to $\theta_m(x,y)$ values of 0° or 180°, respectively. 16 also indicates that $S_{m,n}''(x,y)$ may be either parallel or antiparallel to the direction defined by the signal $S_{m,n}(x,y)$. Determining $S_{m,n}''(x,y)$ may lead to the determining of $S_{m,n}'(x,y)$ and therefore becomes a choice between $S_{m,n}(x,y)$ and $-S_{m,n}(x,y)$.

A region growing scheme may be used to determine whether a positive sign (+) or a negative sign (−) is the correct choice for all the pixels in Eq. 16. In one embodiment, in step 503, prior to the region growing, a phase gradient along an x-axis of $S_{m,n}^2(x,y)$ may be calculated as follows:

$$DX_{m,n}(x,y)=|\arg(S_{m,n}^2(x,y)\cdot S_{m,n}^{2*}(x+1,y))| \qquad \text{Eq. 18}$$

in which |...| represents the magnitude, arg(...) represents the argument, and * represent the conjugate operations. Similarly, $DY_{m,n}$ which represents the phase gradient along a y-axis may also be calculated. Both $DX_{m,n}$ and $DY_{m,n}$ may be within the range of 0° or 180° due to the magnitude operation of Eq. 18. $S_{m,n}^2(x,y)$ may be used instead of $S_{m,n}(x,y)$ to calculate the phase gradients in order to eliminate the intrinsic phase factor $e^{i\theta_m(x,y)}$ that is contained in $S_{m,n}(x,y)$. $DX_{m,n}$ and $DY_{m,n}$ may provide an accurate measure of the phase gradient of $S_{m,n}''(x,y)$ between neighboring pixels, including pixels that may include a change in their intrinsic phase factors. Alternatively, $DX_{m,n}$ and $DY_{m,n}$ may also be processed with low-pass filtering to provide a more smoother phase gradient distribution.

Next, the method may provide a region-growing algorithm, as shown in steps 504–510, similar to the region-growing method shown in FIGS. 3A–3B. For example, referring to FIG. 3A, pixel seeds "A" may be visited and pixels "B" through "E" may be checked. Initial seed pixel "A" may be selected from anywhere on the image, including from background noise regions. To start the region growing, the pixel "A" may be stored on one of multiple pixels stacks (FIG. 3B), where each stack may be initially empty. As the region grows, the four nearest neighboring pixels to pixel "A" ("B", "C", "D", and "E" in FIG. 3A) may be sequentially visited (step 504). Each of these pixels may be placed into a pixel stack according to the $DX_{m,n}$ and $DY_{m,n}$ value for the respective pixel (step 505). For example, if a $DY_{m,n}$ value representing an phase gradient of 12° between pixel "A" and pixel "E", pixel "E" may be placed into stack 2 of an 18 stack configuration. Similarly, if a $DX_{m,n}$ value representing an phase gradient of 25° between pixel "A" and pixel "D", pixel "D" may be placed into stack 3 of an 18 stack configuration. As each pixel is selected, a flag may be used to tag the pixel so that the pixel may not be selected again.

Figure 5:
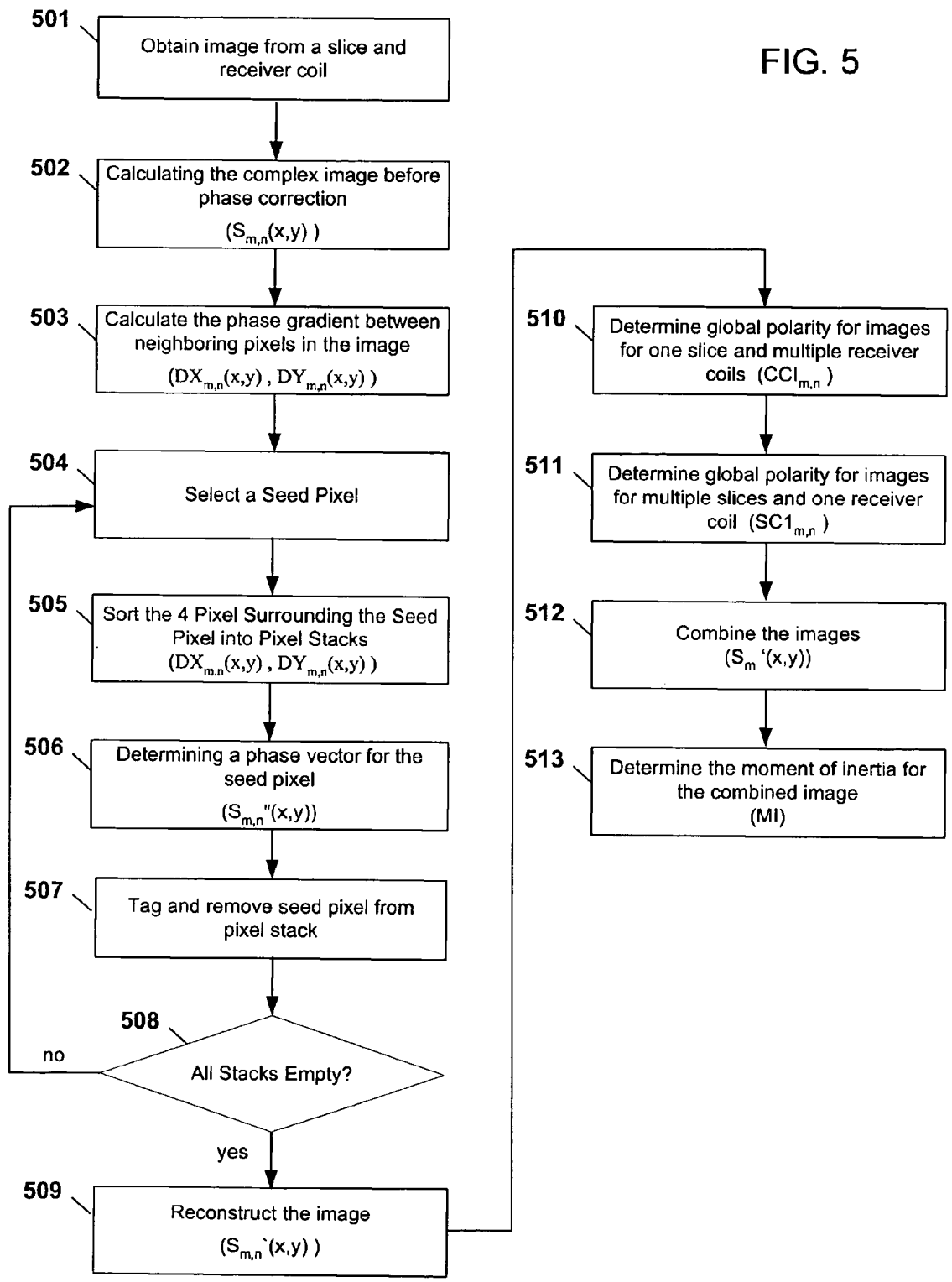
FIG. 5 is a flowchart showing steps of a method in accordance with an embodiment of the present invention.
Figure 6A:
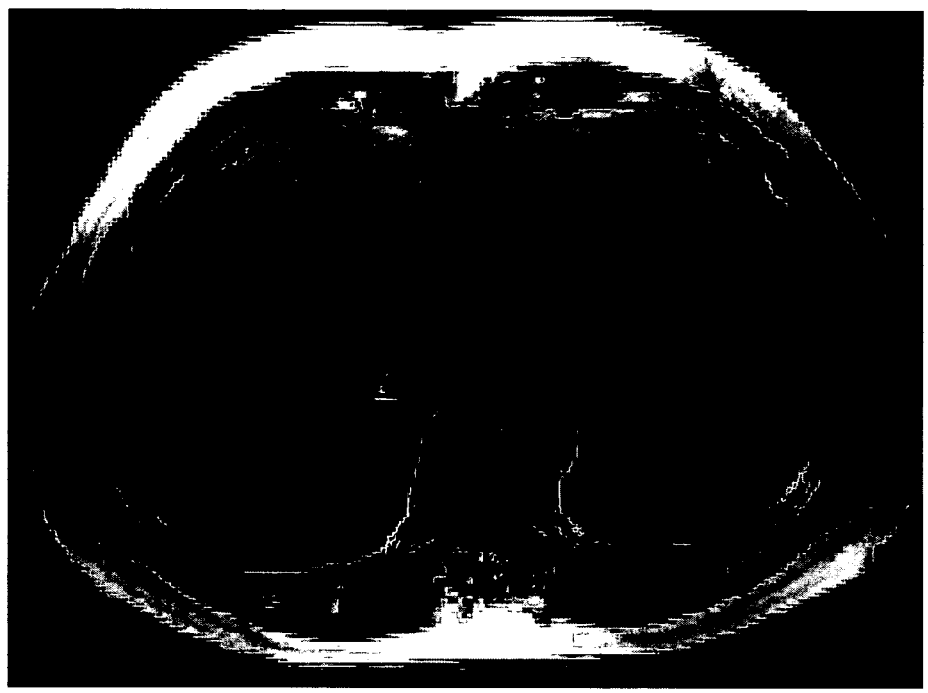
FIG. 6A is an in-phase image in accordance with an embodiment of the present invention.
Figure 6B:
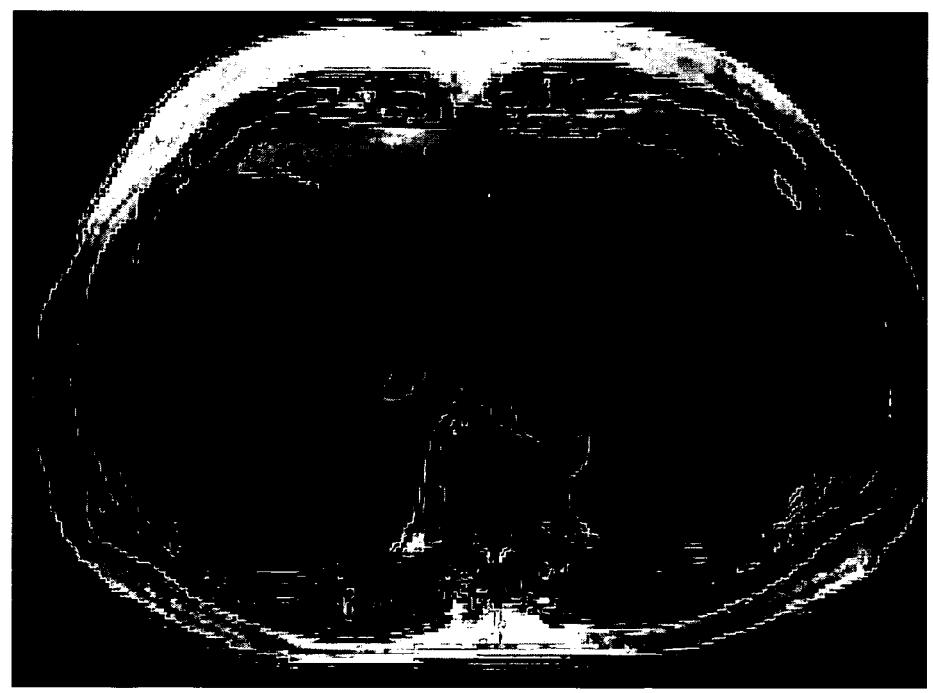
FIG. 6B is an opposed-phase image in accordance with an embodiment of the present invention.
Figure 6C:
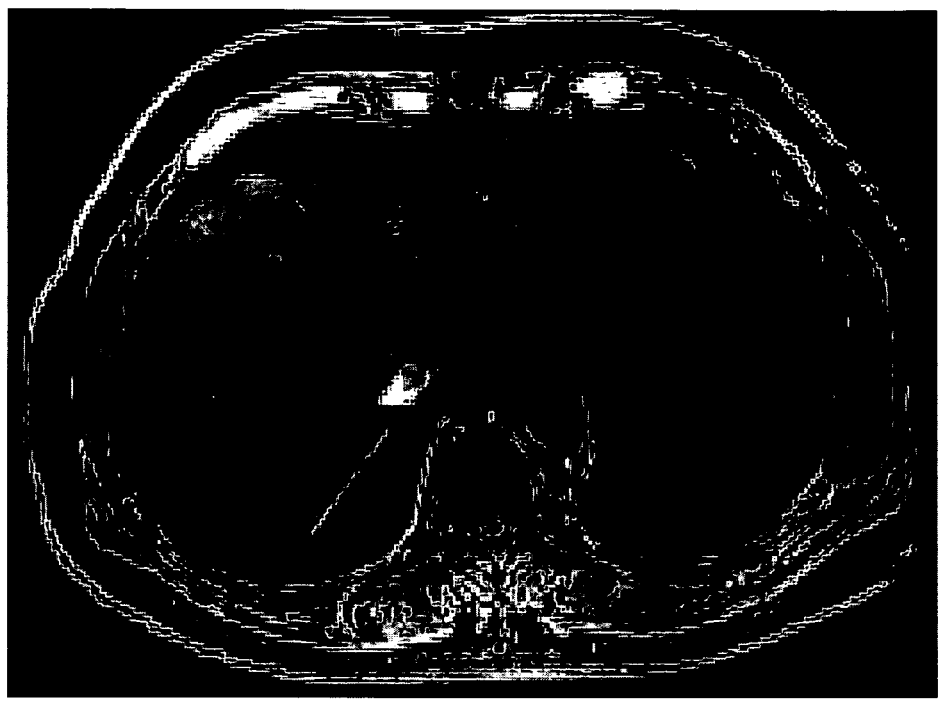
FIG. 6C is a water-only image in accordance with an embodiment of the present invention.
Figure 6D:
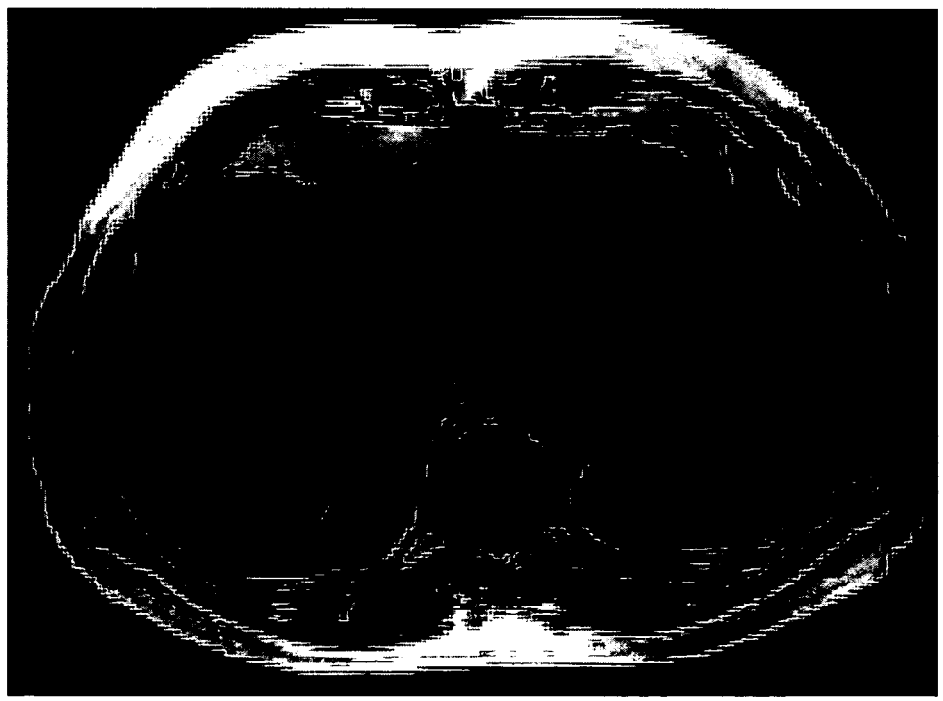
FIG. 6D is a fat-only image in accordance with an embodiment of the present invention.

After each neighboring pixel is visited, the $S_{m,n}''(x,y)$ value may be determined for the initial seed pixel (pixel "A" of FIG. 3A and step 506 of FIG. 5). In some embodiments, for the first initial seed pixel selected, the $S_{m,n}(x,y)$ value may be designated its $S_{m,n}''(x,y)$ value. The seed pixel may next be tagged by setting a mask value from 0 to 1 (step 507), and subsequently removed from the pixel stack.

Steps 504–508 may be repeated until pixel stacks 301 are all empty. In one embodiment, for subsequent steps for the region growing process, a next seed pixel may be selected. In one embodiment, the next seed pixel may be selected from a pixel stack representing the lowest pixel stack number that is not empty. Referring to FIG. 3B, the pixel stack 301 may have pixel stacks 1 through N. The lowest pixel stack representing the lowest the $DX_{m,n}$ and $DY_{m,n}$ value is pixel stack 1. However, pixel "A" may be subsequently removed after assigning the $S_{m,n}''(x,y)$ value, and therefore, may be empty. The next pixel stack representing the lowest $DX_{m,n}$ and $DY_{m,n}$ value is pixel stack 2. Pixel stack 2 is not empty and currently stores pixel "E". As with the initial seed pixel, the four pixels surrounding the seed pixel (pixels "F", "G", and "I") except for those with a marker indicating selected (pixel "A") may be visited and placed into the pixel stacks 301 according to their $DX_{m,n}$ and $DY_{m,n}$ value. For pixel "E" to be checked and moved out of the pixel stack, the $S_{m,n}''(x,y)$ value may be estimated for pixel "E" using pixels that may have already been checked and is located in a close neighborhood of the pixel "E", such as pixel "A". The estimation may be expressed as:

$$S_{m,n}''{}_{est}=\Sigma S_{m,n}''(x,y)\cdot Chk_{m,n}(x,y) \qquad \text{Eq. 19}$$

in which $Chk_{m,n}$ may be the mask flag which may indicate whether a pixel has previously been checked and the summation may be performed over a region centered at seed pixel. In another embodiment, the local linear phase components that may be present in $S_{m,n}''$ may also be corrected for a more accurate estimation as follows:

$$S_{m,n}''{}_{est}=\Sigma S_{m,n}''(x,y)\cdot e^{-ia_x(x-x_0)}\cdot e^{-ia_y(y-y_0)} Chk_{m,n}(x,y) \qquad \text{Eq. 20}$$

where $a_x$ and $a_y$ are the local linear phase slopes along x and y directions respectively and may be determined as follows:

$$a_x=\arg\{\Sigma S_{m,n}(x,y)S_{m,n}^*(x+1,y)\} \qquad \text{Eq. 21}$$

$$a_y=\arg\{\Sigma S_{m,n}(x,y)S_{m,n}^*(x,y+1)\} \qquad \text{Eq. 22}$$

where $S_{m,n}(x,y)$ is given by Eq. 14, and the summation may be performed over a local region (e.g., as defined by a boxcar) center at the seed pixel. The region used for summation in Eq. 19 or Eq. 20 may be flexible as long as the angle of $S_{m,n}''{}_{est}$ is determined within 90°. In some embodiments, a 21×21 region size may provide a stable estimate for the direction of $S_{m,n}''(x,y)$ within a local region of the seed pixels. The direction of $S_{m,n}''{}_{est}$ for the seed pixel may then be compared with the direction of its $S_{m,n}''(x,y)$. If the phase gradient between $S_{m,n}''{}_{est}$ and $S_{m,n}''(x,y)$ is less than 90°, $S_{m,n}''(x,y)$ takes the value of $S_{m,n}(x,y)$. Otherwise, $S_{m,n}''(x,y)$ takes the value of $-S_{m,n}(x,y)$. The region growing process continues until ever pixel in the image is checked.

It is noted that the use of $S_{m,n}''(x,y)$ instead of only phase factors may weight more strongly the pixels with a higher magnitude. Noise pixels which may have phases that are randomly distributed may not affect the evaluation of $S_{m,n}''_{est}$.

The value of $S_{m,n}''(x,y)$ after the region growing process may be used in Eq. 15 through Eq. 17 to calculate the PSIR image $S_{m,n}'(x,y)$ (step 509). However, the phase of $S_{m,n}''(x,y)$ may be subject to uncertainty for pixels with low signals or artifacts. As a result, $S_{m,n}''(x,y)$ may not be the optimal representation for the actual direction of the signals due to the error phase. To mitigate the problem, an average (for example, using an 11×11 kernel size) of $S_{m,n}''(x,y)$ may be calculated and used for the final phase correction. An advantage of using the averaged $S_{m,n}''(x,y)$ may be that the phase fluctuation may effectively be minimized without affecting the spatial resolution of the final PSIR image. For the regions with low SNR, the processing may lead to a noticeable increase in SNR because the noise in the phase may be suppressed by a low-pass filtering The image reconstruction algorithm described above may be applied to images from each slice and from each receiver coil (steps 501–509 may be repeated for all images obtained from multiple-slices and multiple-receiver coils). The pixel value of every IR image after phase correction may be directly proportional to the amplitude of the longitudinal magnetization right before excitation. However, if the initial seed selected for region growing has an incorrect $S_{m,n}''(x,y)$, the intrinsic phases for all the pixels in the image may be inverted. Indeterminate global polarity may result in incorrect combination of images from different coils and inconsistent display for images of different slices. In one embodiment, to ensure that the global polarity for images of different coils at a given slice is consistent, the coil correlation index may be calculated as follows:

$$CCI_{m,n} = \sum_{(x,y)} S'_{m,n}(x,y) \cdot S'_{m,n+1}(x,y) \quad \text{Eq. 23}$$

where the summation may be performed over the entire image matrix and n and n+1 may be indices for two neighboring coils (step 510). Alternatively, the summation may be performed over a selected sub-region or sub-regions of the image, or even down to a single pixel with sufficient SNR and sufficiently well-defined phase for images from two neighboring coils. Since the intrinsic phase factors for $S_{m,n}'(x,y)$ and $S_{m,n+1}'(x,y)$ may be the same for all pixels, $CCI_{m,n}$ may be positive if the global polarities between the two images is consistent. If $CCI_{m,n}$ is negative, the global polarity for one of the two images may be inverted to make their global polarity consistent. After the images from all the different coils have consistent polarity, the images may be combined as follows:

$$S'_m(x,y) = \frac{\sum_n S'_{m,n}(x,y)}{\left|\sum_n S'_{m,n}(x,y)\right|} \cdot \sqrt{\sum_n S'^2_{m,n}(x,y)} \quad \text{Eq. 24}$$

where $$\frac{\sum_n S'_{m,n}(x,y)}{\left|\sum_n S'_{m,n}(x,y)\right|}$$

may be used to determine the polarity of each image pixel (step 512).

To ensure consistency of the global polarity of images from different slices, two-slice correlation indices may be calculated fro two neighboring slices of a given coil as follows:

$$SCI_{m,n}^{(-)} = \sum_{(x,y)} |S''_{m,n}(x,y) - S''_{m+1,n}(x,y)| \quad \text{Eq. 25a}$$

$$SCI_{m,n}^{(+)} = \sum_{(x,y)} |S''_{m,n}(x,y) + S''_{m+1,n}(x,y)| \quad \text{Eq. 25b}$$

where the summation may be performed over the entire image matrix (step 511). Alternatively, the summation may be performed over a selected sub-region or sub-regions of the image, or even down to a single pixel with sufficient SNR and sufficiently well-defined phase for images from two neighboring slices. When the image polarity between the images of two slices is consistent, $SC1_{m,n}^{(-)}$ may be smaller than $SC1_{m,n}^{(+)}$ because the actual phase errors contained in $S_{m,n}''(x,y)$ may vary slowly in space. Similarly, if the image polarity between two images of two slices is inconsistent, $SC1_{m,n}^{(-)}$ may be smaller than $SC1_{m,n}^{(-)}$.

In other embodiments, the check for the inter-slice and inter-coil polarity consistencies may be calculated using Eq. 23 and Eqs. 25a and 25b for all slices. However, the entire set of slices may still have the polarity inverted, such as when the image used as the reference during the inter-slice polarity check is incorrect. In order to correct the polarities, a moment of inertia (MI) of the image set may be evaluated as follows:

$$MI = \sum_m \sum_{(x,y)} S'_m(x,y)(x^2 + y^2) \quad \text{Eq. 26}$$

where x and y may have the origin at the center of the mass (step 513). Alternatively, x and y may have the origin at the center of the images. In one example, since fat (with the shortest T1) and CSF (with the longest T1) may be predominately distributed at the periphery and the central portion of the brain, respectively, the MI of the image set with the correctly determined global polarity may be positive.

In another embodiment, data may be acquired using a one-point Dixon technique by which water and fat signals may be shifted by a phase angle θ. The value of θ may be controlled by an echo time (TE) in the case of gradient echo pulse sequence. Alternatively, for spin echo techniques, θ may be controlled by the value of the time shift from a spin echo position. The image may be processed into a separate water-only and a fat-only image. In one embodiment, the Fourier transform of the time-domain data from a one-point Dixon acquisition, may be expressed as follows:

$$S = (W + e^{i\theta}F)e^{i\Phi} \qquad \text{Eq. 27}$$

in which W and F represent the water and fat signal intensity, respectively. $\Phi$ is the phase error due to the field inhomogeneity and other system imperfections.

The same phase correction algorithm as described above for two-point Dixon chemical shift imaging or phase sensitive inversion recovery imaging may be used to determine the phase factor $e^{i\Phi}$. Once the phase factor is determined on a pixel-by-pixel basis, it may be eliminated from Eq. 27, resulting in a phase corrected image:

$$S' = Se^{-i\Phi} \qquad \text{Eq. 28}$$

Finally, the water and fat images are decomposed from S' as follows:

$$F = \text{Imag}(S')/\sin(\theta) \qquad \text{Eq. 29}$$

$$W = \text{Real}(S') - F\cos(\theta) \qquad \text{Eq. 30}$$

EXAMPLES

The following examples are included to demonstrate specific embodiments of this disclosure. It should be appreciated by those skilled in the art that the techniques disclosed in the examples that follow represent techniques discovered by the inventors to function well in the practice of the invention, and thus can be considered to constitute specific modes for its practice. However, those skilled in the art should, in light of the present disclosure, appreciate that many changes can be made in the specific embodiments which are disclosed and still obtain a like or similar result without departing from the spirit and scope of the invention.

Example 1

Reconstructing Images Using a 2-Point Dixon Technique

As shown in FIGS. 6A–6D and FIGS. 7A–7B, the resulting images are from the reconstruction and phase correcting methods. The images are from abdominal examinations using 1.5 Tesla MRI scanners and a four-channel torso phased-array receiver coil. In one embodiment, the scanning protocol may include: a sequence repetition time of 150 ms, an echo time (TE) of 2.2 ms for opposed-phase images, an TE of 4.7 ms for in-phase images, a receiver bandwidth of ±62.5 KHz, an acquisition matrix of 256×192 pixels, a field of view of 36×27 cm, a slice thickness of 5–7 mm, and a gap of 0–1 mm. The protocol may generate approximately 20 slices collected within 20 s. Thus, the entire abdomen may be scanned in one or two breath holds.

In one embodiment of the invention, the reconstruction of the water-only and fat-only images may be performed offline using an IBM ThinkPad PC with an Intel processor (e.g., x86 family operating at approximately 896 MHz) operating on the Microsoft Windows 2000 platform within controller 102 of FIG. 1. Additionally, MATLAB software running on the ThinkPad PC may be utilized to implement the reconstruction algorithm. In one embodiment, the phase-correction portion of the algorithm performed on the reconstructed images with data combined four receivers may take approximately 14 seconds for a 256×192 pixels image. The images may then be outputted to an output of choice such as display monitor 103 or printer 104 of FIG. 1. The images may also be installed into an image database for archiving and filming.

FIGS. 6A–6D show an example of four images from a patient with a healthy liver including an in-phase image, an opposed-phase image, a water-only image and a fat-only image, respectively. Using the method described above, there was not a single water and fat misidentification within the water-only and the fat-only images. For example, in FIG. 6B, there is a visible disconnection between regions of tissues because of the low signal void in the lung and signal cancellation along the water and fat interfaces. As a result of the method, uniform and consistent water and fat separation may be achieved throughout the field of view. Another advantage of the 2PD processed images is the superior signal-to-noise ratio in the water-only and fat-only images as compared to the in-phase and opposed-phase images, which may be appreciated from FIGS. 6A–6D with all the images being windowed and scaled at the same level.

Figure 7A:
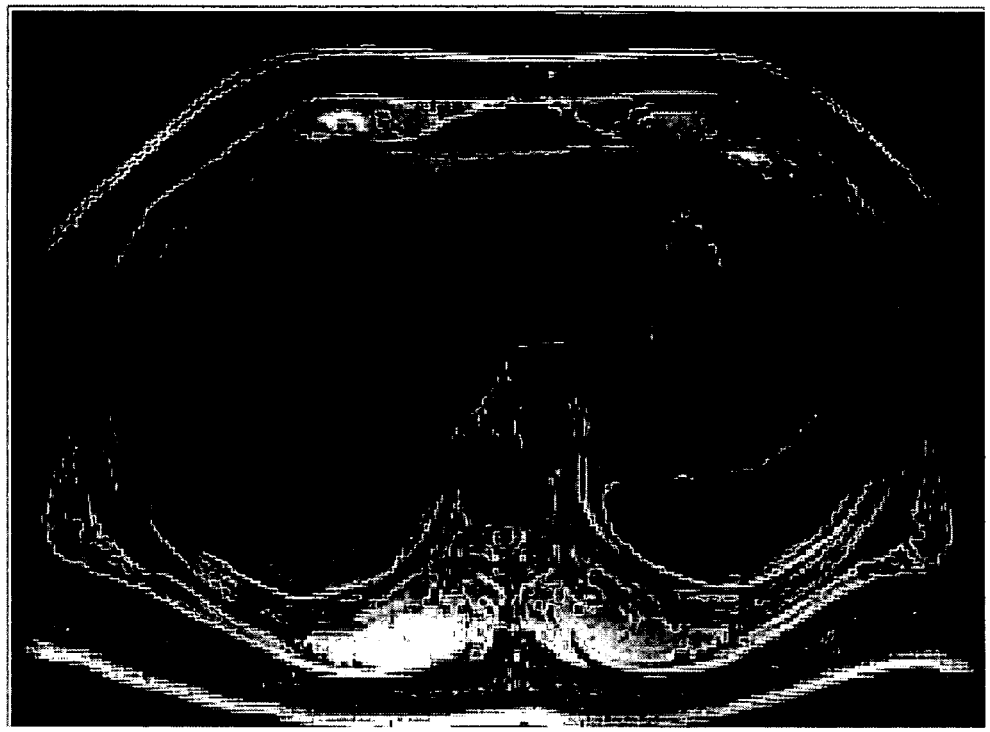
FIG. 7A shows another water-only image in accordance with an embodiment of the present invention.
Figure 7B:
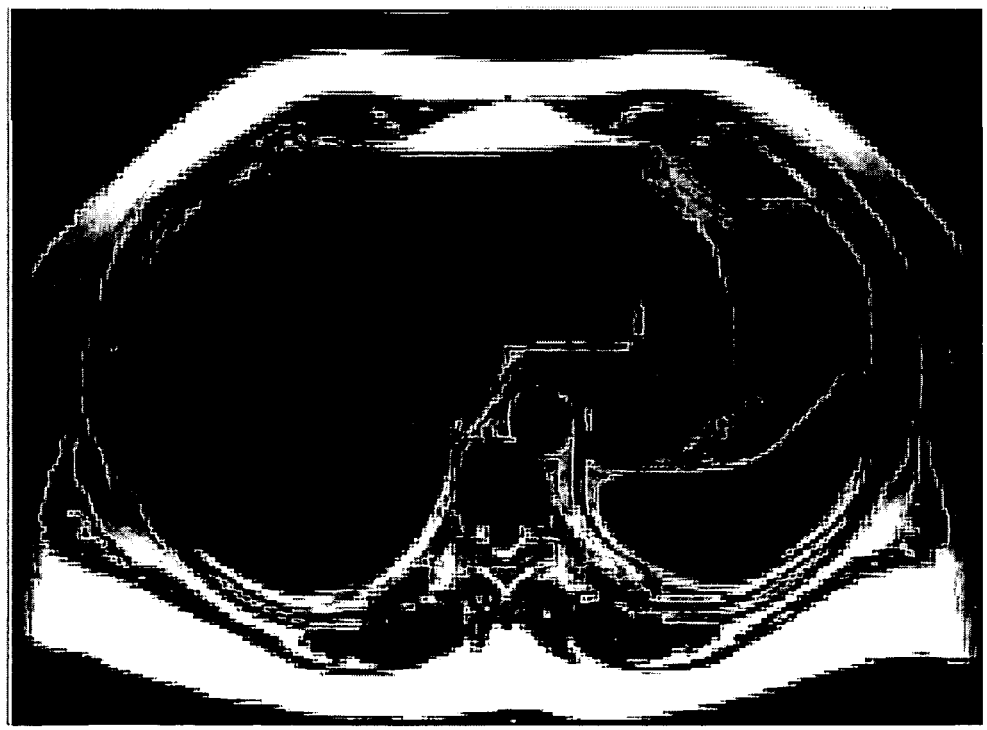
FIG. 7B shows another fat-only image in accordance with an embodiment of the present invention.

The water-only and fat-only images, shown in FIGS. 7A and 7B respectively, is another example of a slice taken from a patient with metastatic carcinoid tumor and possible hepatic steatosis. As with FIGS. 6A–6D, the water and fat are cleanly separated.

The two major disadvantages of the Dixon techniques are the long data acquisition time needed and the lack of a robust and efficient phase-correction algorithm. By utilizing the 2PD and fast gradient-echo dual-echo acquisition, the scan time is greatly reduced relative to those of a 3PD implementation and conventional spin-echo acquisitions. As a result, breath hold examinations of the entire abdomen may be performed with complete removal of respiratory artifacts. A different approach to minimize the scan time in Dixon imaging may be to exploit the inherent encoding effect in the sensitivity maps of a phased-array coil, such as parallel imaging methods. Further, by using a combined sensitivity encoding (SENSE) and Dixon techniques, the total scan time may be reduced significantly. Such an approach may be combined with the 2PD methods described above to further reduce the scan time.

Implementing the phase-correction algorithm allows for the sequence of region-growing to be automatically sorted using multiple predefined and static pixel stacks, without dynamic pixel reordering. The number of pixels stacks may vary such that as the number of pixel stacks increase, the sequence defined by the algorithm may more closely approximate that defined by the minimum spanning tree, although in an efficient manner. Using both the phase and amplitude of the signals from a group of neighboring pixels to guide the selection of the signal direction for a given pixel may allow for proper and automatic phase correction of the 2PD technique. The algorithm may thus easily handle the signal voids along water and fat boundaries or regions of low signal-to-noise ratio, which have caused substantial problems in previous phase-correction methods.

The phase correction algorithm may also be applicable for 2PD data acquired with other pulse sequences or to phase-correction problems such as in phase-sensitive inversion-recovery imaging. The algorithm may also be adapted for use with one-point Dixon imaging to further reduce the scan time. Although the phase correction may not directly generate an unwrapped phase image, the correctly determined phase vector image may facilitate phase image determination if needed. Determining true phase distribution is known to be useful in areas such as field inhomogeneity mapping or temperature imaging. For these applications, a correctly determined phase vector image can serve as a guide for phase unwrapping or may be directly integrated to determine the actual phase. Although not directly affecting the phase vector determination, the presence of phase poles may still complicate the actual phase determination by either approach.

In a different embodiment of the present invention, the two-dimensional (2D) region growing may also be expanded to 3-dimensional (3D) region growing algorithm. The 3D algorithm may be applied either directly to 3D images or to a series of 2D images stacked sequentially according to their spatial locations. In the 3D algorithm, the region growing from a seed pixel may visit all the six nearest neighbor pixels (in comparison to four in the 2D case) and the directional estimation for the seed pixel would be based on the amplitude and phase of the pixels within a 3D pixel area centered at the seed pixel. The advantage of 3D region growing will allow for an easier region-growing into isolated image regions on 2D images.

Example 2

Phase Sensitive Inversion Recovery Imaging of Multi-Slice and Multi-Coil Data

As noted above, phase-sensitive inversion recover (PSIR) image reconstruction scheme uses both the magnitude and the phase information of the signals for phase correction. The phase correction component may be extended and optimized from a region growing scheme for Dixon water and fat chemical shift imaging. The methods provided by example require neither selection of an empirical phase threshold nor explicit use of a special phase filter. Further, the global polarity of images from different receiver coils and from different slices may be made consistent by exploiting the inter-coil and inter-slice correlation intrinsic to the original complex images.

Figure 8:
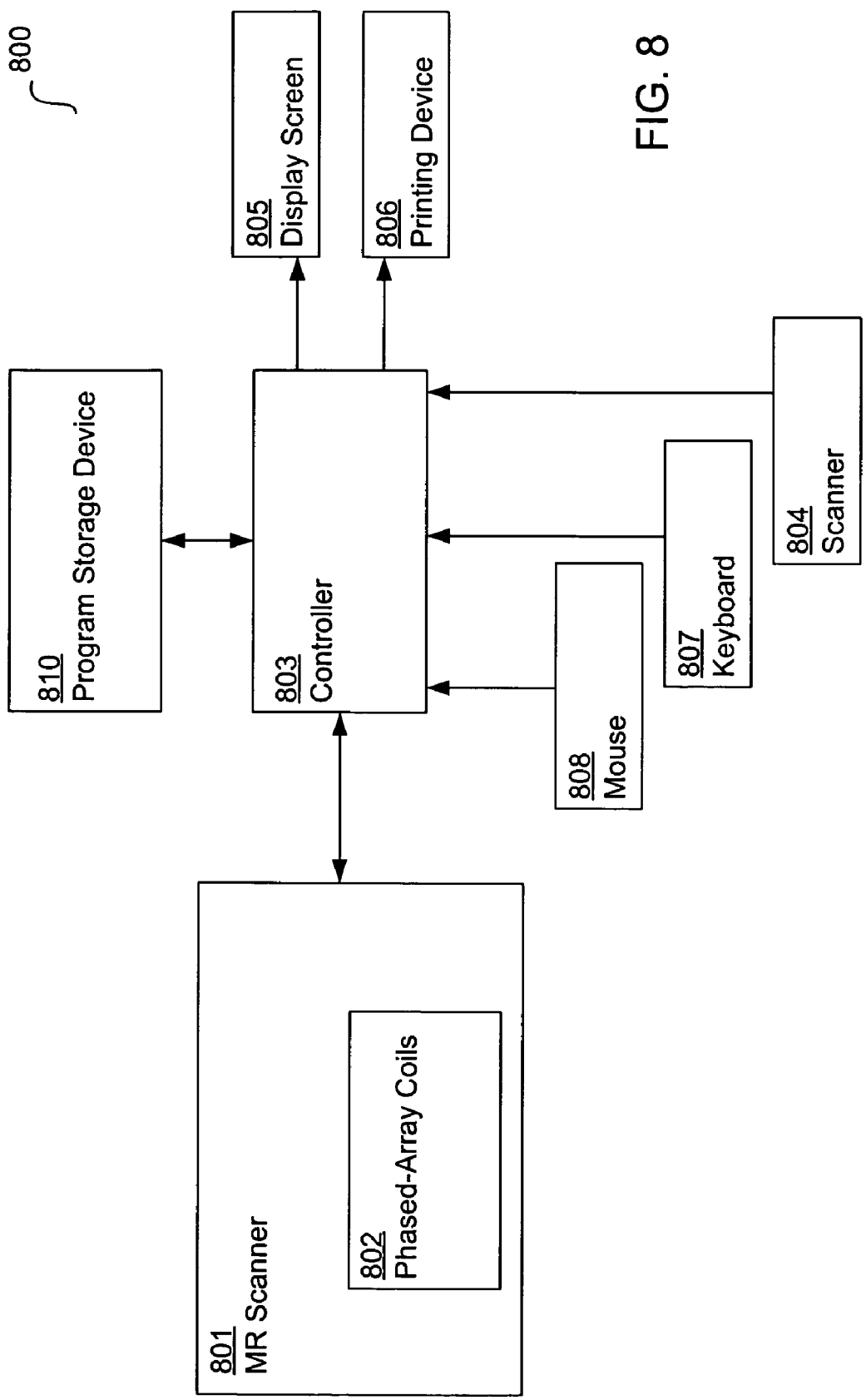
FIG. 8 illustrates an MRI imaging system in accordance with an embodiment of the present invention.
Figure 9D:
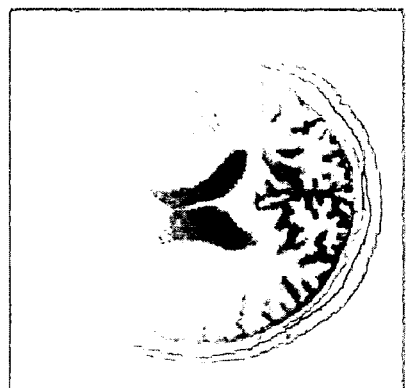
FIGS. 9A–9H show a series of images from eight individual coils after phase correction in a phase-sensitive inversion recovery image reconstruction process in accordance with an embodiment of the present invention.
Figure 9C:
Figure 9B:
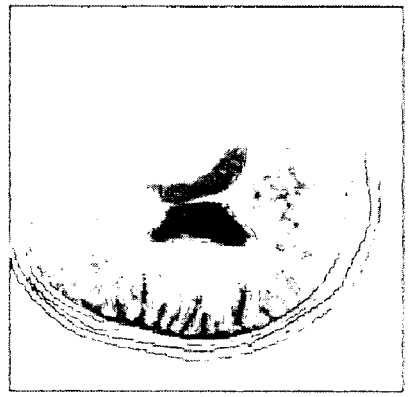
Figure 9A:
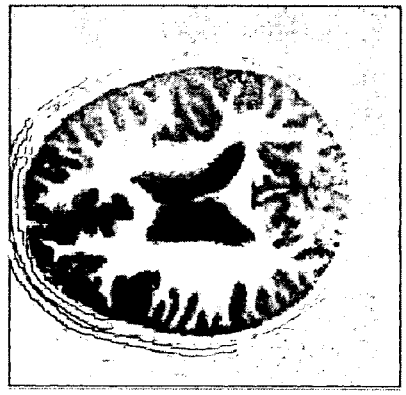
Figure 9H:
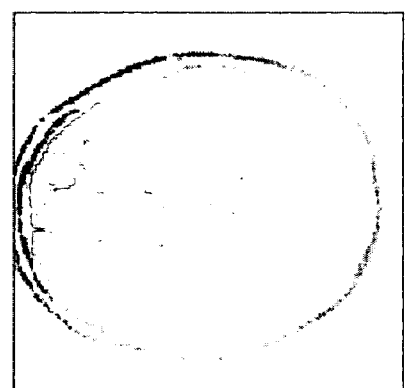
Figure 9G:
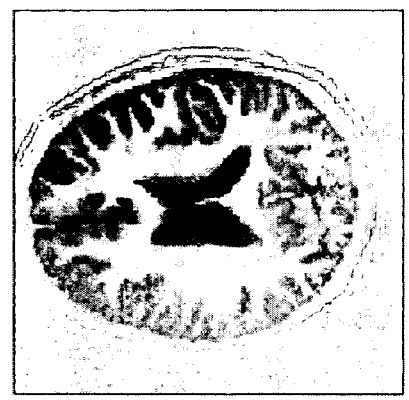
Figure 9F:
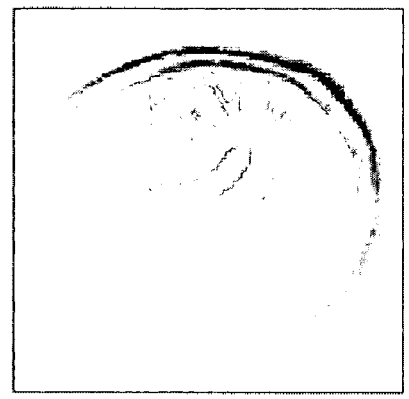
Figure 9E:
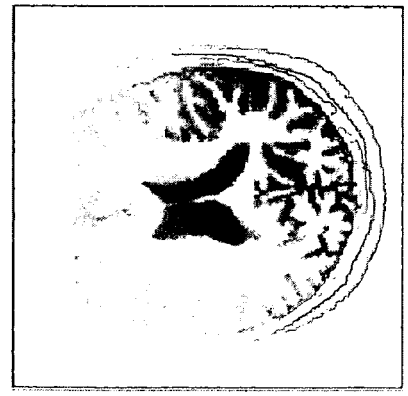
Figure 12A:
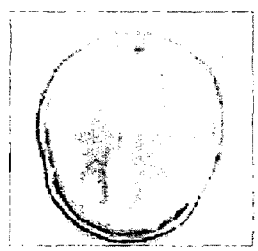
FIGS. 12A–12H show a series of images with different polarities after phase correction for one slice and eight different coils in accordance with an embodiment of the present invention.
Figure 12B:
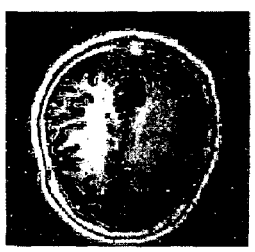
Figure 12C:
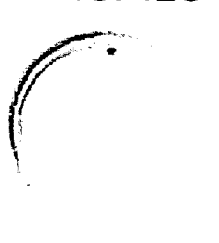
Figure 12D:
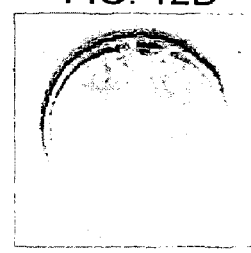
Figure 12E:
Figure 12F:
Figure 12G:
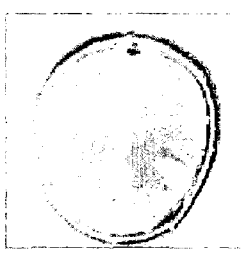
Figure 12H:
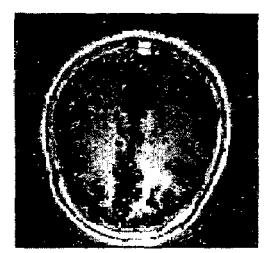
Figure 13A:
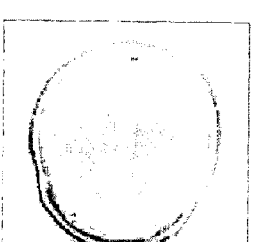
FIGS. 13A–13H show a series of images of FIGS. 7A–7H with consistent polarities in accordance with an embodiment of the present invention.
Figure 13B:
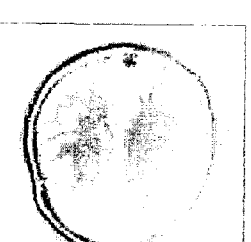
Figure 13C:
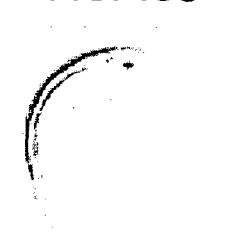
Figure 13D:
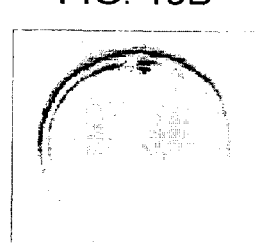
Figure 13E:
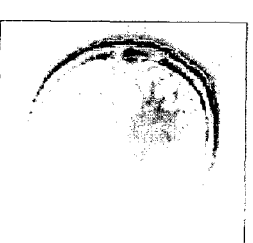
Figure 13F:
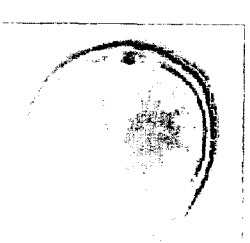
Figure 13G:
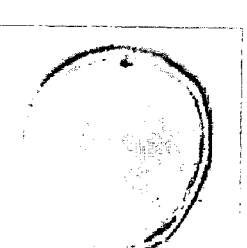
Figure 13H:
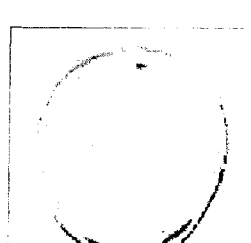
Figure 16A:
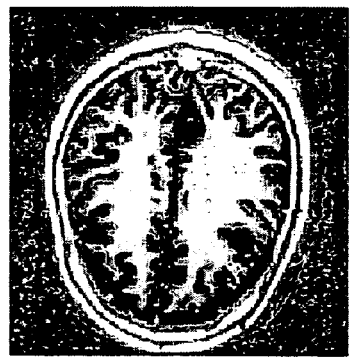
FIGS. 16A–16E show a series of five images of FIGS. 14A–14E with consistent and correct polarities in accordance to embodiments of the present invention.
Figure 16B:
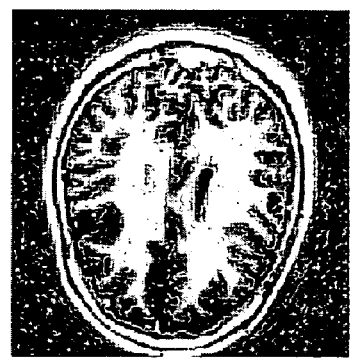
Figure 16C:
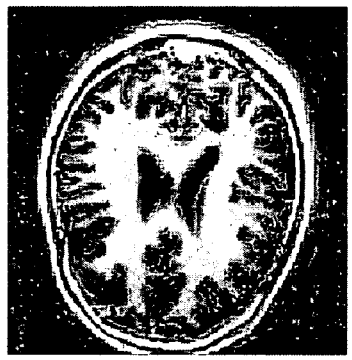
Figure 16D:
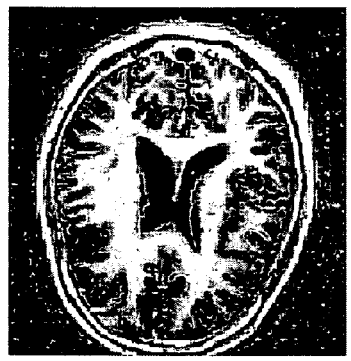
Figure 16E:
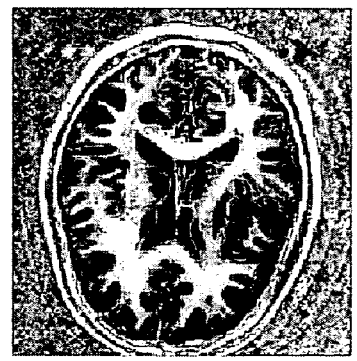

Referring to FIG. 8, a system 800 including MR scanner 801 such as the General Electric Signa 3.0 Tesla whole-body MR scanner (GE Healthcare, Waukesha, Wis.) using an IR fast spin-echo pulse sequence and head coil 802 such as an 8-channel phased array head coil (MRI Devices, Gainesville, Fla.) is presented. The system may also include a controller 803, a scanner 804, output devices such as a display screen 805, an output printing device 806, and input devices such as a keyboard 807 and a mouse 808. To obtain an image, a patient is placed inside a scanner 801, which receives instructions about generating image data from the controller 804. In some embodiments, the controller 804 may be a programmable circuit, such as a microprocessor or a digital signal processor-based circuit, that operates in accordance with instructions stored in program storage device 810. Program storage device 810 may be any type of readable memory including, but not limited to, a magnetic or optical media such as a card, tape, or disk, or a semiconductor memory such as a PROM or FLASH memory. The controller 803 obtains the data, processes the data to obtain desired image(s), and outputs the final image(s) to an output device of choice, such as a display monitor 805 or a printer 806. One of the various methods that may be utilized by the controller 803 is shown in FIG. 8. The controller 804 may also receive user input from input devices such as a keyboard 807 or a mouse 808, which dictates the type of images that are taken of the patient.

The imaging parameters used were repetition time (TR)= 3665 ms, echo time=8.3 ms, T1=425 ms, echo train length=8, field of view=20 cm, slice thickness=4 mm, slice gap=1 mm, receiver bandwidth=±32 kHz, 1 signal average, and imaging matrix=256×256. The IR fast spin echo sequence uses an efficient distributed interleave acquisition and collects twenty-one slices in 2:09 minutes. The PSIR image-reconstruction schemes were implemented in MAT-LAB (The MathWorks, Natick, Mass.).

FIGS. 9A–9H show the PSIR images of a representative slice from each of the eight receiver coils. Despite the presence of low SNR regions in each of the images due to coil sensitivity shading, the phase correction algorithm performed well in all the individual images. The global polarity of the images from the third, sixth and eighth coils, however, is apparently flipped. Using the image from the first coil as the starting reference and Eq. 15, the coil correlation indices between the consecutive coil pairs are $6.3822\times10^{11}$, $-3.7493\times10^{11}$, $2.3759\times10^{11}$, $4.8572\times10^{11}$, $-4.4139\times10^{11}$, $3.5933\times10^{11}$, $-4.5836\times10^{11}$, respectively. Accordingly, the polarity flip of the images can easily be identified and corrected. The sum-of-square combination of all the images after polarity check is shown in FIG. 10A. Even though a TR/TE of 3665/9.3 ms was used for data acquisition, excellent T1 contrast, particularly between white matter and gray matter, is appreciated. In contrast, the combined magnitude image of the same slice shows the undesired contrast reversal between white matter and gray matter, as shown in FIG. 10B FIGS. 11A–11L show 12 of the 21 consecutive slices of PSIR images from the first receiver coil. Likewise, FIGS. 12A, 12C, 12D, 12E, 12F, and 12G have their global polarity flipped. The slice correlation indices calculated according to Eq. 25a and Eq. 25b between consecutive pairs of slices are listed in Table 1. As such, the polarity flips for FIGS. 11B, 11C, 11E, 11G, 11K, and 11L can be identified and corrected. Similarly, FIGS. 13A–13H show that the polarity inconsistency for images in FIGS. 12A–12H can be identified and corrected. Finally, the moment of inertia for the twelve slices in FIGS. 11 after coil combination is calculated according to Eq. 26 and listed in Table 2. The MI for all the slices is found to be positive. In comparison, the total net magnetization (NM), which is also listed in Table 2, is found to an unreliable indicator for the global polarity.

TABLE 1

| | Slice Correlation Indices ($\times 10^7$) | | | | | | | | | | |
|---|---|---|---|---|---|---|---|---|---|---|---|
| | a–b | b–c | c–d | d–e | e–f | f–g | g–h | h–i | i–j | j–k | k–l |
| $SC1_{m,n}^{(-)}$ | 22.3 | 5.4 | 22.5 | 23.3 | 23.2 | 23.4 | 4.0 | 4.4 | 4.6 | 23.7 | 5.3 |
| $SC1_{m,n}^{(+)}$ | 5.19 | 21.9 | 5.3 | 4.8 | 4.4 | 4.1 | 23.4 | 23.3 | 22.9 | 5.2 | 24.6 |

TABLE 2

Slice Dependence of the Moment of Inertia and Net Magnetization

| | a | b | c | d | e | f | g | h | i | j | k | l |
|---|---|---|---|---|---|---|---|---|---|---|---|---|
| MI × $10^{12}$ | 0.78 | 0.73 | 0.72 | 0.53 | 0.55 | 0.41 | 0.51 | 0.61 | 0.73 | 0.84 | 0.85 | 1.09 |
| NM × $10^7$ | 1.1 | 1.2 | 0.9 | −4.2 | −4.1 | −6.3 | −6.2 | −5.3 | −3.6 | −4.9 | −7.2 | −5.3 |

Example 3

Improving Signal-to-Noise in Multi-Slice and Multi-Coil Data

To increase the signal-to-noise ratio (SNR) and/or increase imaging speed, data acquisition in MR imaging is increasingly performed using multiple receiver coils. For image reconstruction methods, such as phase sensitive inversion recovery (PSIR), the images from the multiple receiver coils contain both positive and negative values after a successful phase correction. In order to produce a final image, the images from the different receiver coils must be combined.

According to an embodiment of the present invention, the polarity of the images from one slice of all the different receiver coils is checked for consistency. Referring to FIGS. 12A–12H, the images are from one particular slice but from 8 different receiver coils. These images are a result of a phase correction, but only FIGS. 12B, 12E, and 12H have the correct polarities. As such, the polarities of the images are altered for consistency. The sum over all image pixels can be calculated for two spatially neighboring coils (Eq. 23). If the sum is greater than 0, the polarities between the two coils are consistent. Similarly, if the sum is less, than 0, the polarities between the two coils are inconsistent. In this case, $I_{m,n}(x,y)$ and $e^{i\Phi}$ is changed into $-I_{m,n}(xy)$ and $-e^{i\Phi}$. The changing of the polarity for one of the two coils does not effect the complex image (the product of two negative numbers is a positive number. Upon correction of the differing polarities, the polarity inconsistency in FIGS. 12A–12H is corrected, as shown in FIGS. 13A–13H.

Additionally, the polarity among slices is also checked for consistency. Referring to FIGS. 14A–14E, the images from five different slices of a given coil are inconsistent. Namely, FIGS. 14A and 14C have their polarities reversed. Using Eqs. 25a and 25b the polarities of these figures can be altered. If the result of Eq. 25a is greater than the result of Eq. 25b, the polarities for all the coils corresponding to slice m+1 are changed, as shown in FIGS. 15A–15E.

Once the polarities for all the different coils and slices are consistent, the images can be combined into a final image with an optimal SNR (Eq. 24), as shown in FIGS. 16A–16E. Next, the polarity of the final combined images for all the slices may be determined (Eq. 26). In one embodiment, a given slice may be chosen, such as the middle slice. If the result of Eq. 26 is less than 0, the polarity of all the slices for the combined image is reversed. As shown in FIGS. 16A–16E, the natural contrast and optimal SNR of the images are a result of the above process.

Example 4

Whole Body MRI Using Fast Spin Echo Based Dixon Technique

For MRI, fat suppression is mostly achieved through the chemical shift selective (ChemSat or CHESS) RF pulses. For whole body MRI, such an approach is not feasible because of the large field-of-view and the technique's sensitivity to field inhomogeneity. Previously, T2-weighted MRI with STIR (short tau inversion recovery) for fat suppression has been proposed as a feasible approach for whole body MRI. STIR is usually insensitive to field inhomogeneity. However, STIR has serious disadvantages. For example, images produced from the STIR technique have a reduced signal to noise ratio. Additionally, STIR imaging reduces scan efficiency, and also exacts a significant increase in specific absorption rate (SAR), or RF heating to the body. Other techniques used for fat suppression in 3D gradient echo include the inversion RF pulse, which however, displays many of the disadvantages listed above for STIR. Additionally, use of spectral inversion RF pulses disrupts the steady state of the signals in a 3D gradient echo, and at best suppresses only the fat signals at the central region of k-space, which corresponds to the low-resolution of the image. The phase correction method described above allows for automatic and reliable water and fat imaging with data from a two-point or a one-point Dixon acquisition such that the Dixon acquisition can be implemented with a variety of pulse sequences. As known in the art, there are two major signal relaxation mechanisms that may be used to generate images of desirable contrast: T1 and T2. T1 is a longitudinal regrowth or spin-lattice relaxation process and T2 is a spin-spin relaxation process. These two processes can identify tissue characteristics and allows for control of the contrast of an image.

Figure 17A:
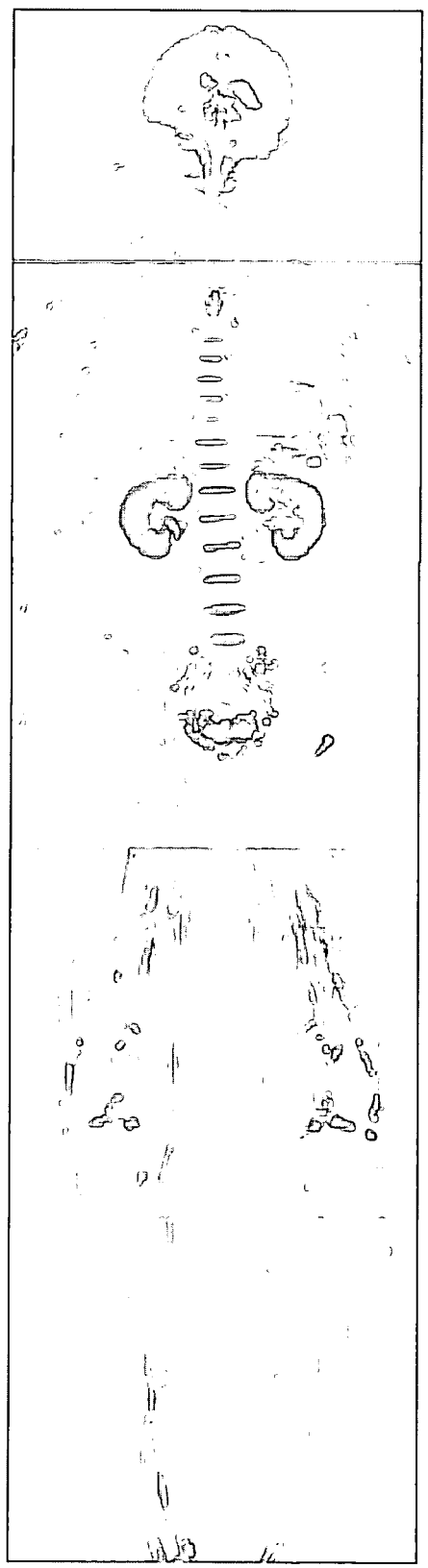
FIG. 17A shows a water only image of a whole body in accordance to embodiments of the present invention.
Figure 17B:
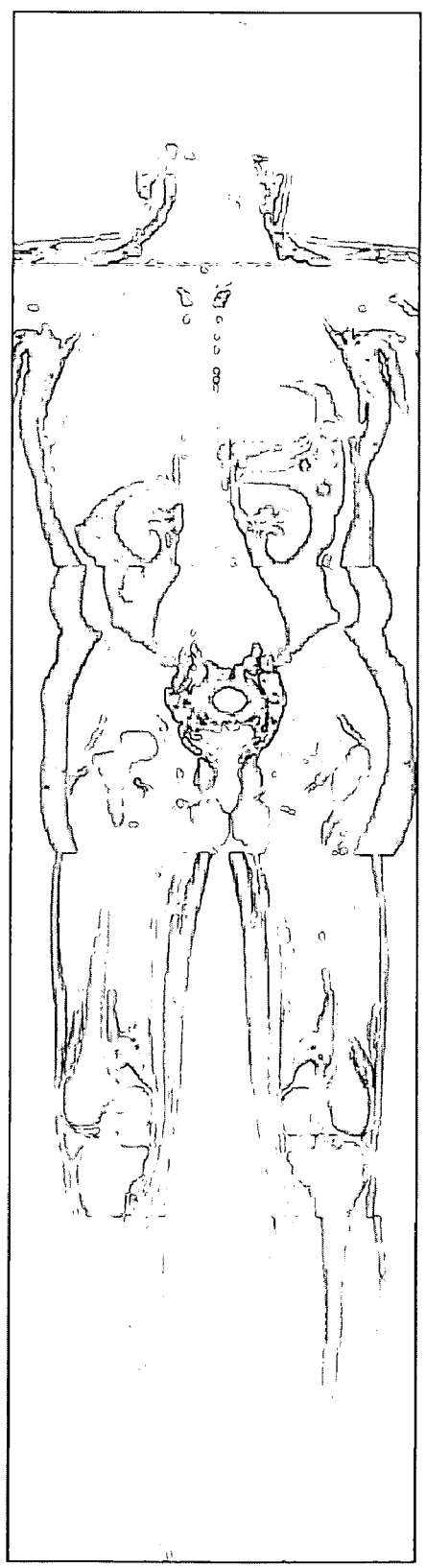
FIG. 17B shows a fat only image of a whole body in accordance to embodiments of the present invention.

In some embodiments, using the phase correction algorithm disclosed above, separate T2-weighted images of an entire body can be obtained with a patient lying on a moving table and in multiple stations. Such water images, for example FIG. 17A, can be used for cancer screening and cancer staging. Additionally, the corresponding fat-only images, for example FIG. 17B, can be used for other purposes, such as for accurate determination of body mass index, or of fat distribution.

In other embodiments, T1-weighted MRI can be used for oncological imaging, with and without an intravenous contrast agent injection. For example, T1-weighted images can be used for lesion detection and lesion characterization. Like in many other cases, fat suppression is often desired because fat obscures true lesions. In other embodiments, T1-weighted images can be used to image an entire body using 3 dimensional (3D) gradient echo sequences.

It will be manifest that various substitutions, modifications, additions and/or rearrangements of the features of the invention may be made without deviating from the spirit and/or scope of the underlying inventive concept. It is deemed that the spirit and/or scope of the underlying inventive concept as defined by the appended claims and their equivalents cover all such substitutions, modifications, additions and/or rearrangements.

The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. The term program, computing device program, and/or software, as used herein, is defined as a sequence of instructions designed for execution on a computer system. A program may include, for example, a subroutine, a function, a procedure, an object method, an object implementation, and an executable application and/or other sequence of instructions designed for execution on a computer system.

REFERENCES

The following references, to the extent that they provide exemplary procedural or other details supplementary to those set forth herein, are specifically incorporated herein by reference.
Ahn and Cho, *IEEE Trans. Med. Imaging*, 6:32–36, 1986.
Bakker et al., *IEEE Trans. Med. Imaging*, 18:371–383, 1984.
Bernstein et al., *Med. Phys.*, 16(5):813–817, 1989.
Borrelo et al., *Magn. Reson. Med.*, 14(1):56–67, 1990.
Bydder and Young, *J. Comput Assist. Tomogr.*, 9(4):659–675, 1985.
Christopher et al., *Neuroradiology*, 32(3):173–178, 1990.
Edelstein et al *J. Comput Assist. Tomogr.*, 7(3):391–401, 1983.
Gowland and Leach, *Magn. Reson. Med.*, 18(1):224–231, 1991.
Hajnal et al *J. Comput Assist. Tomogr.*, 16(6):841–844, 1992.
Ji et al., In: *Phase sensitive inversion recovery imaging using Markov Random Field model*, Proc. 11th Ann. Sci. Meeting ISMRM, Canada, 1069, 2003.
Kellman et al., *Magn. Reson. Med.*, 47(2):372–383, 2002.
Listerud et al., *Magn. Reson. Med.*, 36(2):320–325, 1996.
Ma, In: *Phase-sensitive IR imaging and its application for tissue segmentation*, Proc. $7^{th}$ Ann. Sci. Meeting ISMRM, PA, p. 1652, 1999.
Ma, In: *Phase correction in two-point Dixon water and fat imaging using a three-dimensional region growing algorithm*, Proc. $12^{th}$ Ann. Sci. Meeting ISMRM, Japan, p. 2134, 2004.
Ma, *Magn. Reson. Med.*, 52(2):415–419, 2004.
Mai et al., *Magn. Reson. Med.*, 43(6):793–795, 2000.
McVeigh et al., *Med. Phys.*, 13(6):806–814, 1986.
Moran et al., *Magn. Reson. Imaging*, 4(3):229–235, 1986.
Noll et al., *IEEE Trans. Med. Imaging*, 10:154–163, 1991.
Oh et al., *J. Magn. Reson. Imaging*, 9(6):903–908, 1991.
Park et al., *Magn. Reson. Med.*, 3(1):15–23, 1986.
Roemer et al., *Magn. Reson. Med.*, 16(2):192–225, 1990.
Wehrli et al *J. Comput Assist. Tomogr.*, 8(3):369–380, 1984.
Xiang, et al., *J. Magn. Reson. Imaging*, 6(5):775–782, 1996.

The invention claimed is:

1. A method, comprising:
acquiring a plurality of magnetic resonance imaging (MRI) data signals;
forming complex images from the plurality of MRI data signals;
calculating a first image of a phase gradient between neighboring pixels using the complex images along a first axis;
calculating a second image of a phase gradient between neighboring pixels using the complex images along a second axis;
performing a region-growing algorithm for correcting phase errors in the complex images using the calculated phase gradients; and
reconstructing phase corrected images.

2. The method of claim 1, the step of acquiring the plurality of MRI data signals further comprising acquiring data from multiple slices and multiple receiver coils.

3. The method of claim 2, the step of acquiring data from multiple slices and multiple receiver coils further comprising performing a pulse sequence and a partially parallel imaging technique.

4. The method of claim 3, the partially parallel imaging technique comprising a sensitivity encoding technique.

5. The method of claim 2, the step of acquiring the plurality of MRI data signals further comprising:
acquiring an opposed-phase echo of a first and second signal; and
acquiring an in-phase echo of the first and second signal.

6. The method of claim 5, the first signal comprising a water signal and the second signal comprising a fat signal.

7. The method of claim 5, the step of acquiring the plurality of MRI data signals further comprising performing a gradient echo dual echo sequence.

8. The method of claim 7, the step of performing the gradient echo dual echo sequence comprising performing a two-dimensional gradient echo dual echo sequence.

9. The method of claim 7, the step of performing the gradient echo dual echo sequence comprising performing a three-dimensional gradient echo dual echo sequence.

10. The method of claim 5, the step of acquiring the plurality of MRI data signals further comprising performing a spin echo pulse sequence.

11. The method of claim 10, the step of performing the spin echo pulse sequence comprising performing a two-dimensional spin echo pulse sequence.

12. The method of claim 5, the step of acquiring the plurality of MRI data signals further comprising performing a fast spin echo pulse sequence.

13. The method of claim 12, the step of performing a fast spin echo pulse sequence further comprising performing a two-dimensional fast spin echo pulse sequence.

14. The method of claim 12, the step of performing a fast spin echo pulse sequence further comprising performing a three-dimensional fast spin echo pulse sequence.

15. The method of claim 2, the step of acquiring data from multiple slices and multiple receiver coils further comprising acquiring data from an inversion recovery pulse sequence.

16. The method of claim 15, the step of acquiring data from an inversion recover pulse sequence further comprising acquiring data from an inversion recovery fast spin-echo pulse sequence.

17. The method of claim 16, the step of performing a fast spin echo pulse sequence further comprising performing a two-dimensional fast spin echo pulse sequence.

18. The method of claim 16, the step of performing a fast spin echo pulse sequence further comprising performing a three-dimensional fast spin echo pulse sequence.

19. The method of claim 15, the step of acquiring data from an inversion recovery pulse sequence further comprising acquiring data from an inversion recovery two-dimensional gradient echo.

20. The method of claim 15, the step of acquiring data from an inversion recovery pulse sequence further comprising acquiring data from an inversion recovery three-dimensional gradient echo.

21. The method of claim 2, the step of acquiring data from multiple slices and multiple receiver coils further comprising acquiring a one-point Dixon echo comprising water and fat signals.

22. The method of claim 21, the step of acquiring a one-point Dixon echo further comprising performing a gradient echo sequence.

23. The method of claim 22, the step of acquiring a one-point Dixon echo further comprising a two-dimensional gradient-echo sequence.

24. The method of claim 22, the step of acquiring a one-point Dixon echo further comprising a three-dimensional gradient-echo sequence.

25. The method of claim 21, the step of acquiring a one-point Dixon echo further comprising performing a spin echo sequence.

26. The method of claim 25, the step of acquiring a one-point Dixon echo further comprising performing a two-dimensional spin-echo sequence.

27. The method of claim 21, the step of acquiring a one-point Dixon echo further comprising performing a two-dimensional fast spin echo pulse sequence.

28. The method of claim 21, the step of acquiring a one-point Dixon echo further comprising performing a three-dimensional fast spin echo pulse sequence.

29. The method of claim 21, further comprising shifting the water and fat signals by a phase angle.

30. The method of claim 29, the step of shifting further comprising adjusting the phase angle by adjusting an echo time.

31. The method of claim 29, the step of shifting further comprising adjusting the phase signal by adjusting a time shift.

32. The method of claim 2, the step of reconstructing further comprising calculating coil-correlation for maintaining polarity consistency from different receiver coils.

33. The method of claim 2, the step of reconstructing further comprising calculating slice correlation for maintaining polarity consistency from different slices.

34. The method of claim 2, the step of reconstructing further comprising calculating slice correlation for water and fat identification for a two-point Dixon chemical shift imaging.

35. The method of claim 34, further comprising using intensity histogram information in a separated water-only and fat-only image.

36. The method of claim 34, further comprising using phase gradient information in phase gradient images.

37. The method of claim 2, the step of reconstructing the phase corrected image further comprising calculating a moment of inertia for determining a correct polarity for images from multiple slices.

38. The method of claim 1, the step of reconstructing the phase corrected images further comprising forming T2-weighted water and fat images from a Dixon chemical shift imaging.

39. The method of claim 38, the step of forming T2-weighed water and fat images further comprising forming T2-weighted water and fat images of a whole body.

40. The method of claim 1, the step of reconstructing the phase corrected images further comprising forming T1-weighted water and fat images from a Dixon chemical shift imaging.

41. The method of claim 40, the step of forming Ti-weighed water and fat images further comprising forming T1-weighted water and fat images before and after a contrast agent injection into a patient.

42. The method of claim 1, the first axis being along an x-axis of the image.

43. The method of claim 1, the second axis being along a y-axis of the image.

44. The method of claim 1, the step of performing the region-growing algorithm further comprising:
selecting an initial seed pixel;
selecting four nearest neighboring pixel surrounding the initial seed pixel;
placing each of the four nearest neighboring pixel within a corresponding pixel stack; and
assigning the initial seed pixel a new variable representing a direction of a phase vector.

45. The method of claim 44, the corresponding pixel stacks being empty prior to the region growing algorithm.

46. The method of claim 44, the step of selecting the initial seed pixel comprising randomly selecting the initial seed pixel.

47. The method of claim 44, the step of selecting the initial seed pixel comprising selecting the initial seed pixel using a predetermined criterion.

48. The method of claim 47, the predetermined criteria comprising selecting a pixel with a minimum phase gradient.

49. The method of claim 44 further comprising assigning a value within a mask representing the selected initial seed pixel.

50. The method of claim 44 further comprising assigning a value within a mask for each of the selected four nearest neighboring pixel.

51. The method of claim 44, the step of placing each of the four nearest neighboring pixel within a corresponding pixel stack depends on a phase gradient value.

52. The method of claim 44, further comprising placing the initial seed pixel within a pixel stack.

53. The method of claim 52, further comprising removing the initial seed pixel from the pixel stack.

54. The method of claim 44, the step of performing the region growing algorithm further comprising selecting a subsequent seed pixel.

55. The method of claim 54, the subsequent seed pixel being selected from a pixel stack, the pixel stack comprising pixels with a lowest phase gradient value.

56. The method of claim 55, the pixel stack having at least one pixel stored within the pixel stack.

57. The method of claim 54, the step of performing the region algorithm further comprising selecting neighboring pixels closest to the subsequent pixel stacks that have not been selected.

58. The method of claim 57, further comprising placing selected neighboring pixels with a corresponding pixel stack according a phase gradient value.

59. The method of claim 54, further comprising estimating the direction of a phase vector for the subsequent seed pixel.

60. The method of claim 59, the step of estimating further comprising using both an amplitude and phase of pixels that lie within a neighborhood of the subsequent seed pixel and that have been previously selected as a seed pixel.

61. The method of claim 59, the step of estimating further comprising calculating amplitude weighted phase vectors.

62. The method of claim 60, the step of estimating further comprising correcting a linear phase of the amplitude weighted phase vectors.

63. The method of claim 59, the step of estimating further comprising using the estimated direction of the phase vector to determine a phase vector of the subsequent seed pixel.

64. The method of claim 54, further comprising repeating the selection of subsequent seed pixels until all pixels have been selected as a seed pixel.

65. The method of claim 1, the step of reconstructing further comprising correcting pixels with incorrect phase vectors.

66. The method of claim 1, the step of reconstructing further comprising averaging signal directions of a surrounding pixels area and comparing the average with a signal direction of pixels with incorrect phase vectors.

67. The method of claim 66, further comprising averaging signal directions for a region of the image, and using the averaged signal direction to calculate the phase vector.

68. A method comprising:
acquiring an opposed-phase echo of a first signal and a second signal and an in-phase echo of a first signal and a second signal;
forming complex images from the first and second signals;
calculating a first image of a phase gradient between neighboring pixels using the complex images along a first axis;
calculating a second image of a phase gradient between neighboring pixels using the complex images along a second axis;
performing a region-growing algorithm for correcting phase errors in the complex images using the calculated phase gradients; and
reconstructing phase corrected images.

69. The method of claim 68, the step of acquiring further comprising using a sensing encoding technique.

70. The method of claim 68, the step of acquiring further comprising performing a two-dimensional gradient-echo dual-echo sequence.

71. The method of claim 68, the step of acquiring further comprising performing a three-dimensional gradient-echo dual-echo sequence.

72. The method of claim 68, the step acquiring further comprising performing a spin-echo sequence.

73. The method of claim 68, the step of acquiring further comprising acquiring the data using a two-dimensional spin echo sequence.

74. The method of claim 68, the step acquiring further comprising performing a two-dimensional fast spin-echo sequence.

75. The method of claim 68, the step acquiring further comprising performing a three-dimensional fast spin-echo sequence.

76. The method of claim 68, the step acquiring further comprising acquiring the first and second signals from multiple-slice and multiple-receiver coils.

77. The method of claim 76, the step of forming complex images further comprising performing a Fourier transform of the first and second signals acquired from the multiple slice and multiple-receiver coils.

78. A method comprising:
acquiring one-point Dixon data;
forming a complex image from the data;
calculating a first image of a phase gradient between neighboring pixels using the complex image along a first axis;
calculating a second image of a phase gradient between neighboring pixels using the complex image along a second axis;
performing a region-growing algorithm for correcting phase errors in the complex image using the calculated phase gradients; and
reconstructing a phase corrected image.

79. The method of claim 78, the step of acquiring further comprising acquiring the one-point Dixon data using a two-dimensional gradient pulse sequence.

80. The method of claim 78, the step of acquiring further comprising acquiring the one-point Dixon data using a three-dimensional gradient pulse sequence.

81. The method of claim 78, the step of acquiring further comprising acquiring the one-point Dixon data using a two-dimensional spin echo sequence.

82. The method of claim 78, the step of acquiring further comprising acquiring the one-point Dixon data using a two-dimensional fast spin echo sequence.

83. The method of claim 78, the step of acquiring further comprising acquiring the one-point Dixon data using a three-dimensional fast spin echo.

84. The method of claim 78, the step of acquiring further comprising using a partially parallel imaging technique sequence.

85. The method of claim 78, the step of using a partially parallel imaging technique further comprising using a sensing encoding technique.

86. The method of claim 78, the step of acquiring further comprising acquiring the first and second signals from multiple-slice multiple-receiver coils.

87. A method comprising:
acquiring inversion recovery prepared data;
forming a complex image from the data;
calculating a first image of a phase gradient between neighboring pixels using the complex image along a first axis;
calculating a second image of a phase gradient between neighboring pixels using the complex image along a second axis;
performing a region-growing algorithm for correcting phase errors in the complex images using the calculated phase gradients; and
reconstructing a phase corrected image.

88. The method of claim 87, the step of acquiring further comprising acquiring the inversion recovery prepared data using a two-dimensional gradient echo pulse sequence.

89. The method of claim 87, the step of acquiring further comprising acquiring the inversion recovery prepared data using a three-dimensional gradient echo pulse sequence.

90. The method of claim 87, the step of acquiring further comprising acquiring the inversion recovery prepared data using a two-dimensional fast spin echo pulse sequence.

91. The method of claim 87, the step of acquiring further comprising acquiring the inversion recovery prepared data using a three-dimensional fast spin echo pulse sequence.

92. The method of claim 87, the step of acquiring further comprising acquiring the data from multiple-slice multiple-receiver coils.

93. The method of claim 92, the step of forming complex images further comprising performing a Fourier transform of the data acquired from the multiple slice and multiple-receiver coils.

94. The method of claim 92, the step of acquiring further comprising using a partially parallel imaging technique.

95. The method of claim 94, the step of using a partially parallel imaging technique further comprising using a sensing encoding technique.

96. A method comprising:
acquiring data from multiple-slices and multiple-receiver coils;
forming a complex image from the data;
calculating a first image of a phase gradient between neighboring pixels using the complex image along a first axis;
calculating a second image of a phase gradient between neighboring pixels using the complex image along a second axis;
performing a region-growing algorithm for correcting phase errors in the complex images using the calculated phase gradients; and
reconstructing a phase corrected image.

97. The method of claim 96, the data comprising two-point Dixon data.

98. The method of claim 96, the data comprising one-point Dixon data.

99. The method of claim 96, the data comprising inversion recovery prepared data.

100. A system comprising:
a magnetic resonance imaging (MRI) scanner for providing a plurality of data signals following a scan;
a fast gradient-echo dual-echo apparatus coupled to the MRI scanner, the apparatus adapted to provide a pulse sequence to collect the data signals;
a controller coupled to the MRI scanner, the controller:
receiving the data signals,
implementing a Dixon technique to produce complex images from the data signals,
calculating a first image and a second image of a phase gradient between neighboring pixels in the complex images along a first and a second axis,
performing a region-growing process for correcting phase errors in the complex images using the calculated phase gradients, and
reconstructing phase corrected images; and
an output device coupled to the controller, the output device adapted to display the phase corrected image.

101. The system of claim 100, the controller adapted to receive data signals from multiple-slice and multiple-receiver coils.

102. The method of claim 100, the data comprising two-point Dixon data.

103. The method of claim 100, the data comprising one-point Dixon data.

104. The method of claim 100, the data comprising inversion recovery prepared data.

105. A system comprising:
a magnetic resonance imaging scanner;
a plurality of coils coupled to the magnetic resonance imaging scanner; and
a controller coupled to the magnetic resonance imaging scanner for:
receiving data from multiple slices and the plurality of coils,
forming complex images from the data,
performing a region-growing algorithm to correct phases of the complex images,
reconstructing the images,
determining polarity consistency between the reconstructed images from different coils for a given one of the multiple slices to thereby ensure coil-to-coil consistency,
determining polarity consistency between the reconstructed images from different slices for a given one of the plurality of coils to thereby ensure slice-to-slice consistency,
correcting polarity inconsistencies of the reconstructed images; and
combining the reconstructed images into a phase corrected image.

106. The method of claim 105, the data comprising two-point Dixon data.

107. The method of claim 105, the data comprising one-point Dixon data.

108. The method of claim 105, the data comprising inversion recovery prepared data.

109. A program storage device readable by a machine, tangibly embodying a program of instructions executable by the machine to perform the method steps for generating high resolution fat-only and water-only images displayable on a graphics display of the machine, the method steps comprising:
acquiring a plurality of magnetic resonance imaging (MRI) data signals;
forming complex images from the plurality of MRI data signals;
calculating a first image of a phase gradient between neighboring pixels in the complex images along a first axis;
calculating a second image of a phase gradient between neighboring pixels in the complex images along a second axis;
performing a region-growing algorithm for correcting phase errors in the complex images using the calculated phase gradients; and
reconstructing a phase corrected image.

110. The program storage device of claim 109, the step of acquiring further comprising acquiring data signals from multiple-slice and multiple-receiver coils.

111. The program storage device of claim 109, the step of acquiring further comprising acquiring two-point Dixon data.

112. The program storage device of claim 109, the step of acquiring further comprising acquiring one-point Dixon data.

113. The program storage device of claim 109, the step of acquiring further comprising acquiring inversion recovery prepared data.

* * * * *